US010110268B2

(12) United States Patent
Smith et al.

(10) Patent No.: US 10,110,268 B2
(45) Date of Patent: *Oct. 23, 2018

(54) CASE FOR AN ELECTRONIC DEVICE AND MANUFACTURING METHODS FOR MAKING A CASE

(71) Applicant: Apple Inc., Cupertino, CA (US)

(72) Inventors: Samuel Gilkison Smith, Cupertino, CA (US); Santhana Krishnan Balaji, Cupertino, CA (US); Jared A. Sartee, Pemberton (CA); Amy Qian, Sunnyvale, CA (US); Pinida J. Moolsintong, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/264,503

(22) Filed: Sep. 13, 2016

(65) Prior Publication Data

US 2017/0005689 A1  Jan. 5, 2017

Related U.S. Application Data

(63) Continuation of application No. 15/219,166, filed on Jul. 25, 2016, which is a continuation of application
(Continued)

(51) Int. Cl.
H04B 1/3888 (2015.01)
B32B 38/00 (2006.01)
(Continued)

(52) U.S. Cl.
CPC ............ H04B 1/3888 (2013.01); A45C 5/02 (2013.01); A45C 11/00 (2013.01); B32B 37/08 (2013.01);
(Continued)

(58) Field of Classification Search
CPC ............ H04B 1/3888; A45C 2011/003; A45C 2011/002; A45C 11/00; A45C 5/02;
(Continued)

(56) References Cited

U.S. PATENT DOCUMENTS 4,259,568 A  3/1981 Dynesen
D623,638 S  9/2010 Richardson et al.
(Continued)

FOREIGN PATENT DOCUMENTS

CN  102215714 A  10/2011
CN  202306564 U  7/2012
(Continued)

OTHER PUBLICATIONS

Japanese Patent Application No. 2016-540278—Office Action dated Apr. 28, 2017.
(Continued)

Primary Examiner — Brandon J Miller
(74) Attorney, Agent, or Firm — Dickinson Wright RLLP

(57) ABSTRACT

An accessory unit includes a front flap and a rear cover. The rear cover includes a recessed portion that defines a chamber and a lip that extends about an opening of the chamber. The chamber is configured to receive a consumer electronic device, and the lip is configured to hold the consumer electronic device therein. The rear cover can include a shell formed from glass fiber reinforced plastics and a lip formed from a thermoplastic. The front flap may include segments formed from panels with folding regions therebetween, which allow the front flap to fold. Further, an end region of the front flap hingedly couples the front flap to the rear cover, such that the front flap may be moved between open and closed configurations. Methods of manufacturing the accessory unit are also disclosed.

15 Claims, 29 Drawing Sheets

Related U.S. Application Data

No. 14/443,040, filed as application No. PCT/US2014/052869 on Aug. 27, 2014, now Pat. No. 9,419,669.

(60) Provisional application No. 61/893,667, filed on Oct. 21, 2013, provisional application No. 61/873,748, filed on Sep. 4, 2013.

(51) Int. Cl.
```
    B32B 37/18      (2006.01)
    B32B 37/08      (2006.01)
    B32B 37/14      (2006.01)
    B32B 37/12      (2006.01)
    H05K 5/02       (2006.01)
    B32B 37/30      (2006.01)
    H05K 5/03       (2006.01)
    G05G 1/02       (2006.01)
    A45C 5/02       (2006.01)
    A45C 11/00      (2006.01)
    H05K 5/00       (2006.01)
```

(52) U.S. Cl.
CPC .......... *B32B 37/1284* (2013.01); *B32B 37/14* (2013.01); *B32B 37/182* (2013.01); *B32B 37/30* (2013.01); *B32B 38/0004* (2013.01); *B32B 38/0008* (2013.01); *B32B 38/0036* (2013.01); *G05G 1/02* (2013.01); *H05K 5/0086* (2013.01); *H05K 5/0226* (2013.01); *H05K 5/0239* (2013.01); *H05K 5/03* (2013.01); *A45C 2011/002* (2013.01); *A45C 2011/003* (2013.01); *B32B 2305/18* (2013.01); *B32B 2305/30* (2013.01); *B32B 2375/00* (2013.01); *B32B 2398/00* (2013.01); *B32B 2457/00* (2013.01)

(58) Field of Classification Search
CPC .. G05G 1/02; B32B 38/0008; B32B 38/0036; B32B 37/08; B32B 37/182; B32B 38/0004; B32B 37/014; B32B 37/1284; B32B 37/301; B32B 2305/18; B32B 2457/00; B32B 2305/00; B32B 2305/30; H05K 5/03; H05K 5/0086; H05K 5/0239; H05K 5/0226

See application file for complete search history.

(56) References Cited

U.S. PATENT DOCUMENTS

| | | |
|---|---|---|
| 8,143,982 B1 | 3/2012 | Lauder et al. |
| 8,167,126 B2 | 5/2012 | Stiehl |
| 8,253,518 B2 | 8/2012 | Lauder et al. |
| 8,474,609 B1 | 7/2013 | Hong et al. |
| D688,251 S | 8/2013 | Akana et al. |
| 8,616,422 B2 | 12/2013 | Adelman et al. |
| 8,704,647 B2 | 4/2014 | Kyung et al. |
| 8,774,446 B2 | 7/2014 | Merenda |
| 8,807,333 B1 | 8/2014 | Cooper et al. |
| 8,878,637 B2* | 11/2014 | Sartee ................. G06F 1/16 206/320 |
| 8,887,903 B2 | 11/2014 | Diebel et al. |
| 8,887,909 B2 | 11/2014 | McCarthy et al. |
| 9,000,871 B2* | 4/2015 | Cencioni ........... G06F 1/1626 206/45.2 |
| 9,008,738 B1 | 4/2015 | Dong |
| 9,072,352 B2 | 7/2015 | Sartee et al. |
| 9,226,559 B1* | 1/2016 | Diebel ................ A45C 11/00 |
| 9,315,004 B2 | 4/2016 | Balaji et al. |
| 9,335,793 B2 | 5/2016 | Rothkopf |
| 9,419,669 B2* | 8/2016 | Smith ................... A45C 5/02 |
| 9,485,338 B2* | 11/2016 | Balaji .................. H04M 1/04 |
| 2011/0073505 A1 | 3/2011 | Stiehl |
| 2011/0163642 A1 | 7/2011 | Rohrbach et al. |
| 2011/0290687 A1 | 12/2011 | Han |
| 2011/0297566 A1* | 12/2011 | Gallagher ........... F16M 11/105 206/320 |
| 2011/0297581 A1 | 12/2011 | Angel |
| 2012/0008269 A1 | 1/2012 | Gengler |
| 2012/0037523 A1 | 2/2012 | Diebel et al. |
| 2012/0044638 A1 | 2/2012 | Mongan et al. |
| 2012/0085679 A1 | 4/2012 | Kim et al. |
| 2012/0088557 A1* | 4/2012 | Liang .................. G06F 1/1628 455/575.1 |
| 2012/0194448 A1* | 8/2012 | Rothkopf ............ A45C 13/002 345/173 |
| 2012/0205277 A1 | 8/2012 | Chang |
| 2012/0217174 A1 | 8/2012 | Ting |
| 2012/0268891 A1 | 10/2012 | Cencioni |
| 2012/0298536 A1 | 11/2012 | Rauta et al. |
| 2012/0325838 A1 | 12/2012 | Huang |
| 2013/0020214 A1 | 1/2013 | Chiou |
| 2013/0032617 A1* | 2/2013 | Adelman ................ A45F 5/00 224/191 |
| 2013/0042581 A1 | 2/2013 | Holben et al. |
| 2013/0095898 A1 | 4/2013 | Altschul et al. |
| 2013/0098782 A1 | 4/2013 | Diebel et al. |
| 2013/0109435 A1* | 5/2013 | McCaughey ......... H01Q 1/243 455/556.1 |
| 2013/0137327 A1 | 5/2013 | Tseng |
| 2013/0147330 A1 | 6/2013 | DiFonzo et al. |
| 2013/0175186 A1 | 7/2013 | Simmer |
| 2013/0241381 A1 | 9/2013 | Hynecek et al. |
| 2013/0277271 A1 | 10/2013 | Toulotte |
| 2014/0076753 A1 | 3/2014 | Limber et al. |
| 2015/0065208 A1 | 3/2015 | Balaji et al. |
| 2015/0263776 A1 | 9/2015 | Shyu et al. |
| 2016/0224238 A1 | 8/2016 | Rothkopf |
| 2016/0336988 A1 | 11/2016 | Smith et al. |
| 2017/0012662 A1 | 1/2017 | Balaji et al. |

FOREIGN PATENT DOCUMENTS

| | | |
|---|---|---|
| CN | 202774742 U | 3/2013 |
| EP | 2521468 A1 | 11/2012 |
| FR | 2968900 A1 | 6/2012 |
| JP | 2002142835 A | 5/2002 |
| JP | 3174584 U | 3/2012 |
| JP | 3178107 U | 8/2012 |
| JP | 2013516272 A | 5/2013 |
| KR | 101188978 B1 | 10/2012 |
| WO | 2011084181 A1 | 7/2011 |
| WO | 2013043465 A1 | 3/2013 |
| WO | 2013106375 A1 | 7/2013 |

OTHER PUBLICATIONS

Australian Patent Application No. 2014315541—Examination report No. 2 dated Jun. 7, 2017.
Chinese Patent Application No. 201480002251.1—First Office Action dated Sep. 21, 2015.
International Search Report and Written Opinion for PCT Application No. PCT/US2014/52869 dated Dec. 3, 2014.
European Patent Application No. 14838829—Supplementary Partial Search Report dated May 11, 2016.
Chinese Patent Application No. 201480002251.1—Second Office Action dated May 18, 2016.
Australian Patent Application No. 2014315541—Examination Report No. 1 dated Nov. 15, 2016.
European Patent Application No. 17184966.4—Extended European Search Report dated May 3, 2018.
Chinese Application for Invention No. 201610936626.2—First Office Action dated May 16, 2018.

* cited by examiner

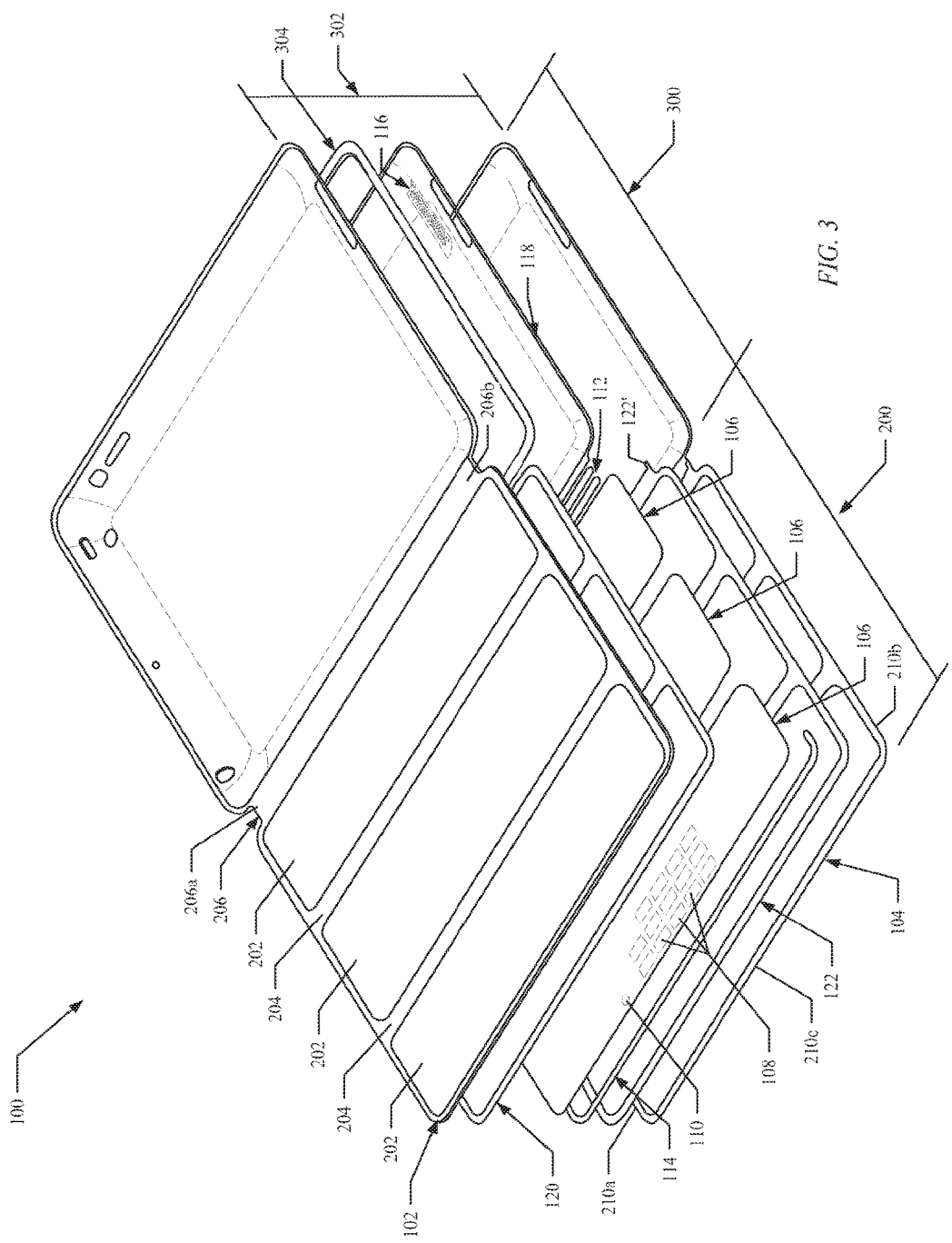

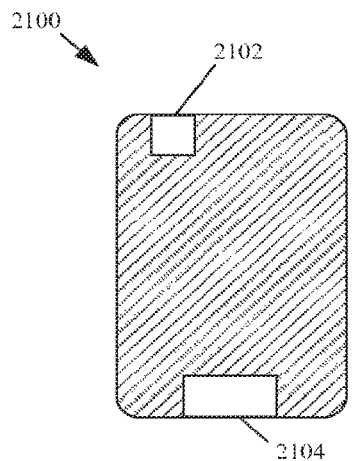
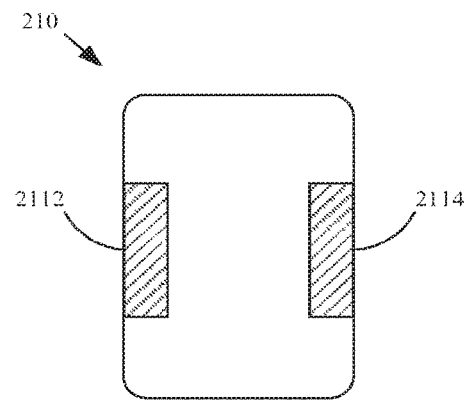
FIG. 21A          FIG. 21B
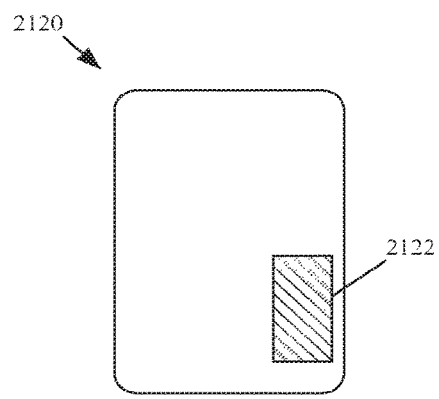
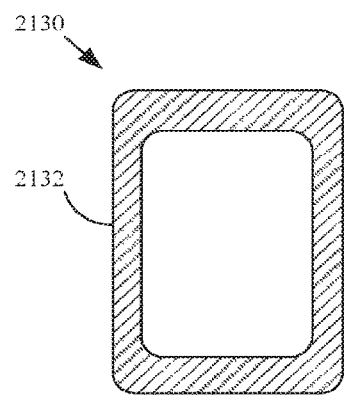
FIG. 21C          FIG. 21D

CASE FOR AN ELECTRONIC DEVICE AND MANUFACTURING METHODS FOR MAKING A CASE

CROSS-REFERENCE TO RELATED APPLICATIONS

This application is a continuation of U.S. application Ser. No. 15/219,166, filed Jul. 25, 2016, entitled "CASE FOR AN ELECTRONIC DEVICE AND MANUFACTURING METHODS FOR MAKING A CASE", which is a continuation of U.S. application Ser. No. 14/443,040, filed May 14, 2015, entitled "CASE FOR AN ELECTRONIC DEVICE AND MANUFACTURING METHODS FOR MAKING A CASE", issued Aug. 16, 2016 as U.S. Pat. No. 9,419,669, which is a U.S. National Stage Application under 35 U.S.C. § 371 claiming priority to PCT Application No. PCT/US2014/052869, filed Aug. 27, 2014, entitled "CASE FOR AN ELECTRONIC DEVICE AND MANUFACTURING METHODS FOR MAKING A CASE" by Smith et al., which claims the benefit of priority: (i) U.S. Provisional Application No. 61/893,667, filed Oct. 21, 2013, entitled "CASE FOR AN ELECTRONIC DEVICE" by Smith et al.; and (iii) U.S. Provisional Application No. 61/873,748, filed Sep. 4, 2013, entitled "FEATURES AND MANUFACTURING METHODS FOR A CASE FOR A PORTABLE ELECTRONIC DEVICE" by Balaji et al., the contents of which are incorporated herein by reference in its entirety for all purposes.

FIELD

The described embodiments relate generally to an accessory of an electronic device. In particular, the present embodiments relate to features of the accessory unit and manufacturing methods for making the accessory unit.

BACKGROUND

As advancements have been made in the field of consumer electronic devices, development of associated accessory units has also occurred. In this regard, some accessory units such as cases are designed to protect consumer electronic devices. Other accessory units are configured to provide consumer electronic devices with increased functionality.

While existing accessory units may function suitably for their intended purposes, further advancements may be desirable. For example, increased functionality or protection for the associated consumer electronic devices may be desirable.

Also, as advancements are made in the field of consumer electronic devices, development of associated accessory units also occurs. In this regard, some accessory units such as cases are designed to protect consumer electronic devices. Other accessory units are configured to provide consumer electronic devices with increased functionality. While existing accessory units may function suitably for their intended purposes, further advancements may be desirable.

SUMMARY

In one aspect, an accessory unit is described. The accessory unit may include a front flap which includes several segments, an inner layer and an outer layer disposed on either side of the several segments. In some embodiments, the inner and outer layers allow the front flap to fold in regions between the several segments. The accessory unit may also include an end region. The accessory unit may also include a rear cover coupled to the front flap. The rear cover may include a shell forming a recessed region. In some embodiments, the inner layer and the outer layer bonded on either side of the shell. The rear cover may also include a lip mechanically coupled along a periphery of the shell, wherein the lip is formed from a material more rigid than the shell and is configured to retain an electronic device within the recessed region of the shell. In some embodiments, the end region of the front flap hingedly couples the front flap to the rear cover and the front flap is configurable between a closed configuration in which the front flap at least partially covers the opening to the recessed region and an open configuration in which the opening to the recessed region is at least partially uncovered.

In another aspect, a method for forming a rear cover of an accessory unit is described. The method may include shaping a recessed cavity from a composite material. The method may also include molding a lip along a periphery of the recessed cavity, wherein the lip is formed from a material capable of co-curing with a resin used in the recessed cavity. The method may also include placing a unidirectional fiber within the lip, wherein the unidirectional fiber extends around a periphery of the lip.

In another aspect, a method for forming a button assembly on an accessory unit is described. In some embodiments, the accessory unit includes a structural shell, an inner cosmetic layer, and an outer cosmetic layer. The method may include creating a chamfered opening in the structural shell. In some embodiments, the chamfered opening is aligned with a button on an electronic device configured to rest within the accessory unit. The method may further include positioning a rigid filler within the chamfered opening. In some embodiments, the rigid filler has a chamfered edge corresponding to the chamfered opening in the structural shell. The method may further include bonding the inner cosmetic layer and outer cosmetic layer on either side of the structural shell, wherein no adhesive is allowed to contact the rigid filler. In some embodiments, the rigid filler is configured to transfer a force exerted on the outer layer to a button disposed on the electronic device.

In another aspect, a button assembly for depressing a button on an electronic device through an accessory having a structural shell, an inner cosmetic layer bonded to the structural shell, an outer cosmetic layer bonded to the structural shell is described. The button assembly may include an opening in the structural shell. The button assembly may also include a region of reduced thickness in the structural shell surrounding the opening in the structural shell. The button assembly may also include an outer button over-molded onto the region of reduced thickness in the structural shell and protruding through the opening in the shell. In some embodiments, the outer button is disposed between the inner cosmetic layer and the outer cosmetic layer. In some embodiments, the outer button is configured to transfer a forced exerted on the outer cosmetic layer to a button disposed on the electronic device.

In another aspect, a case for a portable electronic device having a housing and a display assembly carried by the housing is described. The case may include a recessed portion and a lip portion. The recessed portion may include a side wall. The lip portion may be integrally formed with the recessed portion. The recessed portion and the lip portion may cooperate to define a chamber. The lip portion may further include a resilient material and be configured to retain the portable electronic device within the chamber. The lip portion may further include an edge having a shape that defines an opening suitable for receiving the portable electronic device. While receiving of the portable electronic device into the chamber, the edge may directly engage the housing. The sidewall and the lip portion may cooperate to provide an affirmative feedback indicating that the portable electronic device is fully secured within the chamber.

In another aspect, a method of forming a rear cover configured to receive an electronic device is described. The method may include applying an adhesive to an inner portion of a shell and an outer portion of the shell. The shell may include a lip portion, and the shell may be configured to receive the electronic device. The method further includes applying a first layer to a central portion disposed on the inner portion of the shell. The first layer may be configured to engage the inner portion and the lip portion. The first layer may also include an outer peripheral region. The method further includes expanding the inner layer toward an inner surface of the shell. The inner surface extends around a perimeter of the shell. The method may further include applying a second layer to the outer portion of the shell. The second layer may include an outer peripheral region, and may be configured to engage the lip portion and the outer portion. The outer peripheral region of the second layer may be configured to engage the outer peripheral region of the inner portion. The method may further comprise curing the adhesive.

In another aspect, a method of forming a front cover for an electronic device is described. The may include providing a fabric layer having a top surface and a bottom surface opposite the top surface. The fabric layer may also include a first thickness measuring from a vertical distance between the top surface and the bottom surface. The method may further include positioning the fabric layer such that the fabric layer includes a first elevated portion and a second elevated portion. A non-elevated portion of the fabric layer may extend between the first elevated portion and the second elevated portion. The method may further include applying a first cut on the top surface at the first elevated portion thereby forming a first cut portion. The method may further include removing the first elevated portion.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which:

FIG. 3 illustrates an exploded perspective view of the accessory unit of FIG. 1A in the open configuration;

FIGS. 21A-21D illustrate various embodiments of hybrid shells suitable for use as a shell within an accessory unit;

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

Accessory units are commonly used in conjunction with consumer electronic devices. Some accessory units are configured to protect consumer electronic devices. For example, cases may be employed to partially or fully surround a consumer electronic device such that the consumer electronic device is protected from damage. By way of further example, stands for consumer electronic devices may be configured to prop up the consumer electronic devices such that they may be conveniently positioned for interaction therewith. Another accessory unit can take the form of a foldable cover that can be detachably connected to, for example, a tablet computer. Some accessory units can be configured to move between multiple configurations, including one configuration in which the accessory unit functions as a cover and another configuration in which the accessory unit functions as a stand.

These and other embodiments are discussed below with reference to FIGS. 1-15. However, those skilled in the art will readily appreciate that the detailed description given herein with respect to these figures is for explanatory purposes only and should not be construed as limiting. For the remainder of this discussion, an accessory unit suitable for use with an electronic device will be described. In particular, for simplicity and clarity, for the remainder of this discussion, the electronic device takes the form of a handheld electronic device such as a tablet computer.

Figure 1A:
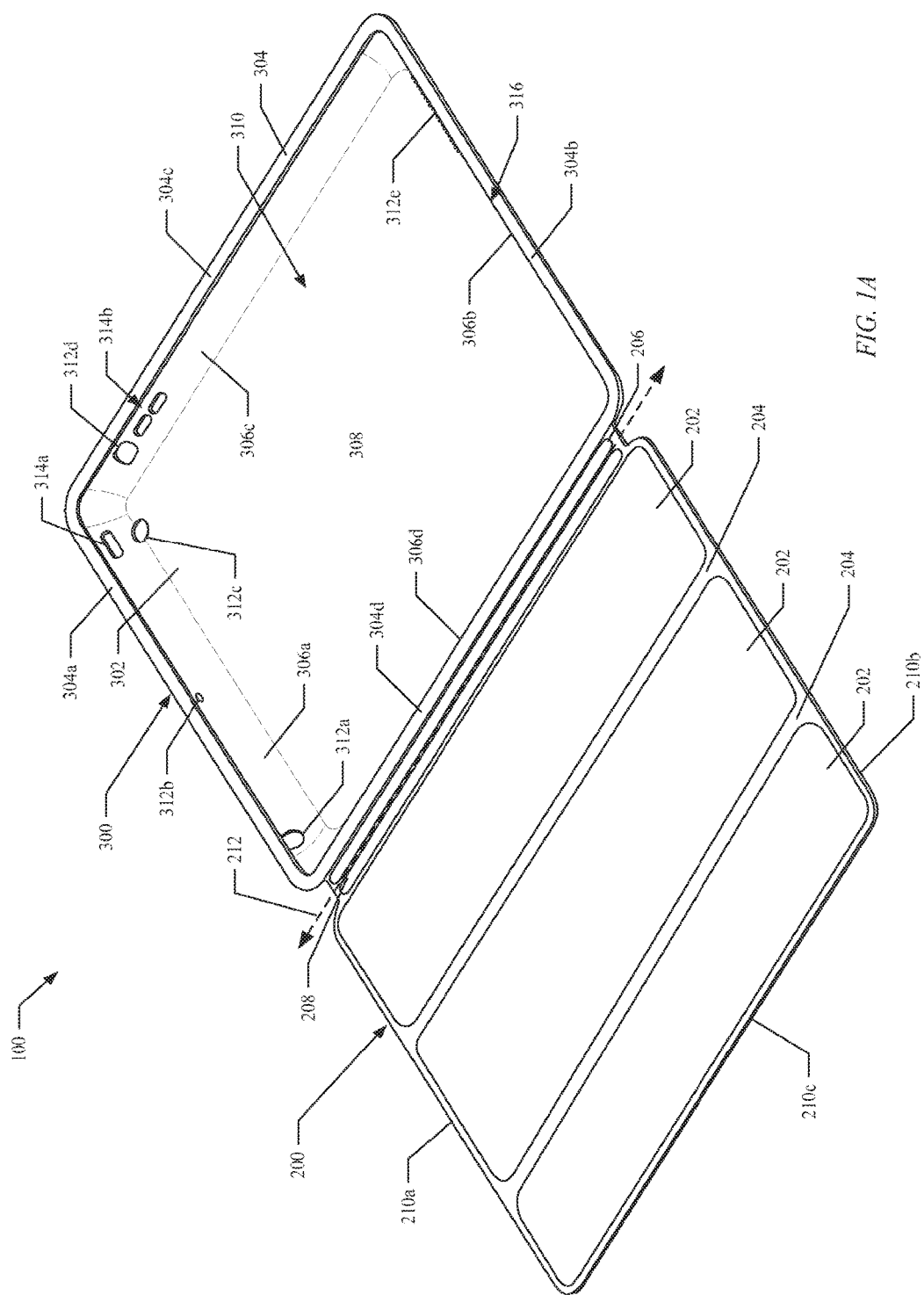
FIG. 1A shows a perspective view of an accessory unit comprising a front flap and a rear cover with the front flap in an open configuration.
Figure 1B:
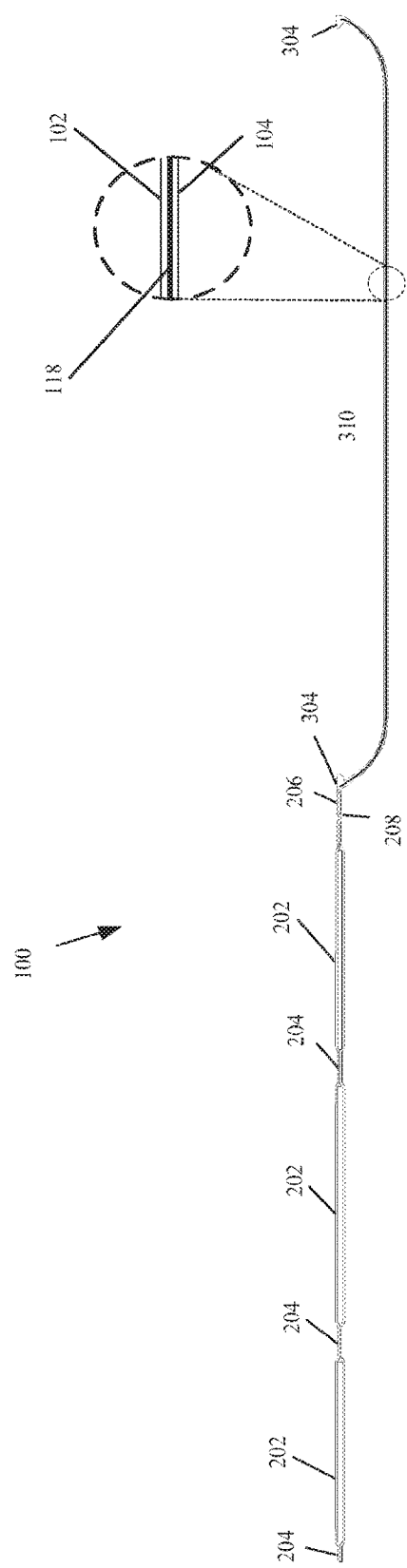
FIG. 1B shows a cross sectional view of the accessory unit shown in FIG. 1A in the open configuration.

In this regard, FIGS. 1A and 1B illustrate an embodiment of an accessory unit 100 according to the present disclosure. As illustrated, the accessory unit 100 can comprise a front flap 200 and a rear cover 300. The front flap 200 can include a plurality of segments 202 and a folding region 204 positioned between each of the segments. The folding regions 204 can be configured to allow the segments 202 to fold with respect to each other. The front flap 200 can also include an end region 206. The end region 206 can hingedly couple the front flap 200 to the rear cover 300.

In a specific embodiment, each of segments 202 can include one or more inserts disposed therein. By way of example, segments 202 can include a pocket region where the inserts are placed, or alternatively the inserts can be embedded within the segments (e.g., via insert molding). If pockets are used, the pocket region can have a size and shape to accommodate corresponding inserts. The inserts can have various shapes but are most typically shaped to conform to the overall look of front flap 200 (e.g., rectangular). The inserts can be used to provide structural support for front flap 200. That is, the inserts can provide stiffness to the cover assembly. In some cases, the inserts can be referred to as stiffeners. The inserts can be formed of rigid or semi-rigid material adding resiliency to front flap 200. Examples of materials that can be used include plastics, fiber glass, carbon fiber composites, metals, and the like. Some of the inserts can be formed of resilient material such as plastic but also arranged to accommodate other components such as magnetic elements described below. Some of the magnetic elements can take the form of magnets, at least one of which can interact with a magnetic sensor disposed within an electronic device associated with accessory unit 100. In some embodiments, some of the magnets can also be arranged to form a magnetic attraction with an attractable magnetic element disposed within at least one insert. In one embodiment, the attractable magnetic elements can be formed of steel, or other ferromagnetic material, and take the shape of a thin sheet incorporated within an insert.

Front flap 200 can be relatively stiff except along folding regions 204 that are thinner and do not include the inserts (e.g., allows folding) making front flap 200 more robust and easier to handle. In addition, the spacing between folding regions 204 can be configured to allow segments 202 to be arranged into a triangular support structure. This triangular support structure can support the electronic device at an angle that allows a user to operate the device without having to support the device with hands. In one embodiment, the triangular support structure can be formed by placing one or more magnets in segments 202 configured to hold the segments together in a desired shape. In another embodiment, friction can be sufficient to maintain the triangular structure without the need for magnets.

The rear cover 300 can include a recessed portion 302 and lip 304. The recessed portion 302 can include a plurality of sidewalls 306a-d (collectively, "306") and a bottom wall 308 that define a chamber 310. The recessed portion 302 can include one or more apertures 312a-e (collectively, "312") and/or one or more embossed portions 314a-b (collectively, "314"). The lip 304 can be coupled to the recessed portion 302 and extend about an opening 316 of the chamber 310. As will be described in further detail below, the recessed portion 302 of the rear cover 300 may be formed from a composite material. Additionally, the lip 304 can be formed from a material that is more rigid than the composite material of the recessed portion 302. In this regard, the lip 304 of the rear cover 300 can be configured to retain a consumer electronic device in the chamber 310, as discussed in detail below. Also, apertures 312 may be employed to provide access to various components of the consumer electronic device such as audio, power, and data ports. Further, one of the apertures 312c may be configured to align with a camera lens of a consumer electronic device (not shown). In this regard, the aperture 312c may be oversized relative to the size of the camera lens in order to ensure that the camera lens is not blocked even when the consumer electronic device is not perfectly aligned in the rear cover 300. In one embodiment, apertures 312 can be punched into a thermoplastic shell that provides structure to accessory unit 100. A liquid crystal polymer fiber can be added around apertures 312 to reinforce apertures 312. In one specific embodiment, a 70 micron thick layer of liquid crystal polymer fiber can be utilized to provide durability to apertures 312. One specific type of liquid crystal polymer fiber that can be utilized for such a purpose is VECTRAN® fiber.

The lip portion 304, including lip portions 304a-d as shown in FIG. 1A, can be integrally formed with the recessed portion 302 and extend about an opening 316 of the chamber 310. It should be noted that in alternate embodiments lip portion 304 can be a separate rigid frame member in contact with recessed portion 302. As will be described in further detail below, the recessed portion 302 of the rear cover 300 may be formed from a flexible material. Additionally, the lip portion 304 may be formed from a material that is more rigid than the flexible material of the recessed portion 302. In this regard, the lip portion 304 of the rear cover 300 may be configured to retain a consumer electronic device in the chamber 310, as discussed in detail below. In some embodiments, the rigidness of lip portion 304 can be due substantially to a thickness of lip portion 304 with respect to recessed portion 302.

Figure 2A:
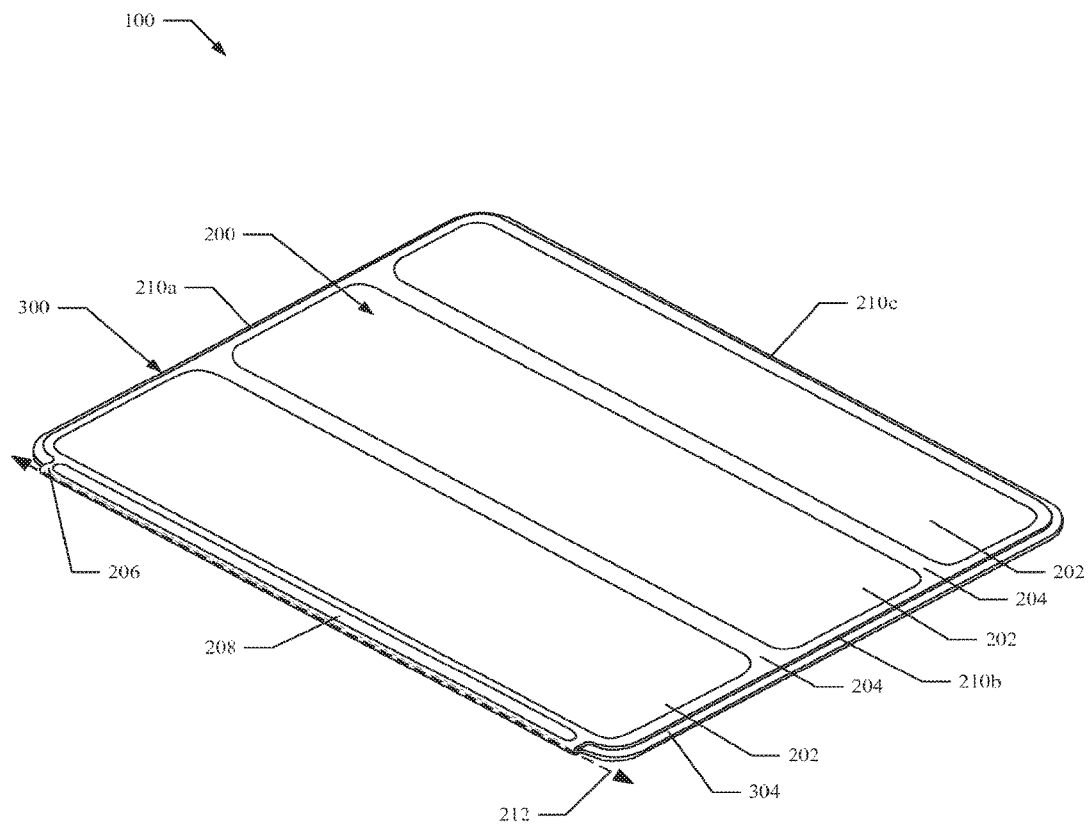
FIG. 2A illustrates a perspective view of the accessory unit of FIG. 1A with the front flap in a closed configuration.
Figure 2B:
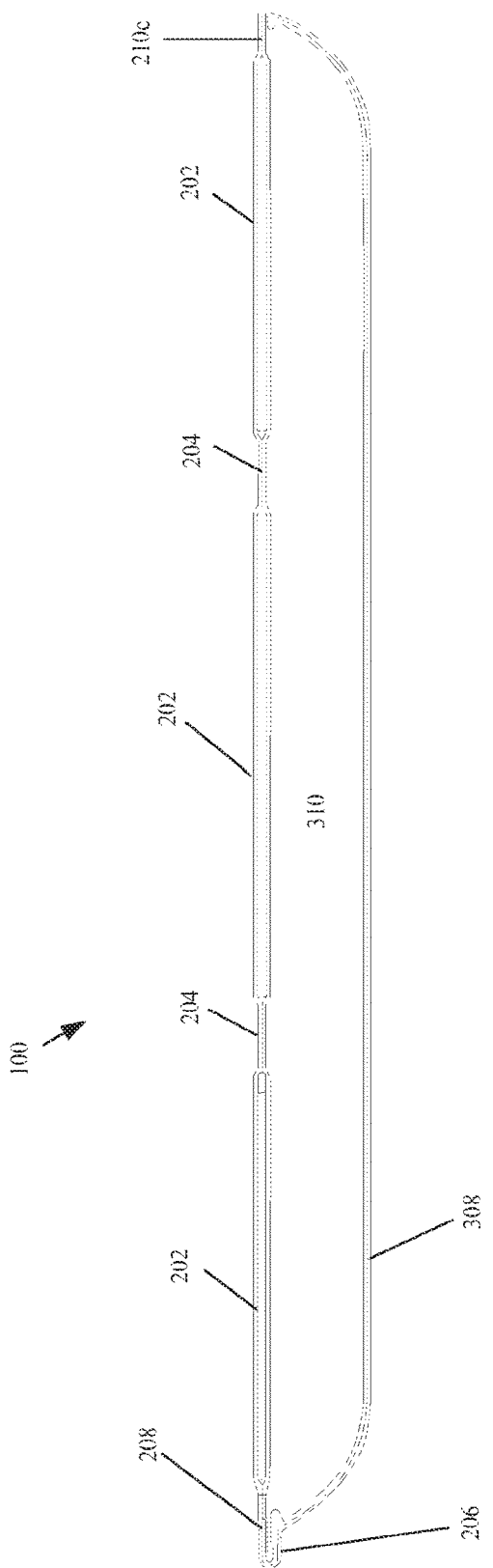
FIG. 2B illustrates a cross sectional view of the accessory unit of FIG. 2A with the front flap in a closed configuration.

The front flap 200 may be configurable between an open configuration (see, e.g., FIG. 1A) and a closed configuration (see, e.g., FIG. 2A). In the open configuration, the front flap 200 is displaced relative to the rear cover 300 such that the opening 316 to the chamber 310 is at least partially uncovered. For example, FIG. 1A illustrates a fully open configuration in which the front flap 200 is out of contact with the lip 304 and the front flap defines a substantially planar configuration. In addition, as was described above, the front flap 200 can also be placed in a triangular configuration when in the open position to form a stand for the electronic device.

As illustrated in FIG. 2A, the edges 210 of the front flap 200 can contact the lip 304 when front flap 200 is in the closed configuration. Accordingly, the front flap 200 can define a substantially planar configuration when moved to the closed configuration. In this regard, the end segment 208 can be substantially coplanar with the other segments 202 and the folding regions 204 of the front flap when the front flap is in the folded configuration. However, a portion of the end region 206 adjacent the end segment 208 can bend to enable end region 206 to function as a hinge.

In some embodiments, as illustrated in FIG. 2A, the lip 304 can extend outwardly beyond the edges 210 of the front flap 200. In this regard, the lip 304 can function to protect a consumer electronic device received in chamber 310 in the rear cover 300 from damage to the edges thereof when dropped or otherwise subjected to impact. However, in other embodiments the edges 210 of the front flap 200 and the lip 304 can extend to the same dimensions, or the edges of the front flap can extend beyond the lip 304.

The material(s) defining the accessory unit 100 may vary. In one example embodiment, the entire accessory unit 100 may be formed from a single material. However, as noted above, in other embodiments it may be desirable to form the accessory unit 100 from multiple materials to take advantage of differing material properties.

In this regard, FIG. 3 illustrates an exploded view of one embodiment of the accessory unit 100 in the open configuration. As illustrated, the accessory unit 100 can include a single sheet of material that defines an inner layer 102 of the front flap 200 and the recessed portion 302 of the rear cover 300. Further, the accessory unit 100 can include a single sheet of material that defines an outer layer 104 of the front flap 200 and the recessed portion 302 of the rear cover 300. In this regard, the recessed portion 302 of the rear cover 300 and the front flap 200 can be at least partially integrally formed in one embodiment, providing a pleasing, continuous appearance to the visible surfaces of accessory unit 100. However, the rear cover 300 and the front flap 200 can be formed from separate materials in other embodiments.

The material(s) defining the inner layer 102 and the outer layer 104 can be the same or different. In one embodiment, both the inner layer 102 and the outer layer 104 can be formed from a microfiber material, leather-like material, or any other technically feasible material. In another embodiment the inner layer 102 can include a microfiber material and the outer layer 104 can include poly urethane type materials such as PUK. In this regard, the inner layer 102 and the outer layer 104 can include materials configured to provide durability, provide flexibility, protect a consumer electronic device, and/or a pleasing aesthetic appearance. In some embodiments the inner layer 102 can also be configured to passively clean the consumer electronic device, which may come into contact with the inner layer while held therein.

In some embodiments, the accessory unit 100 can further include one or more additional materials between the inner layer 102 and the outer layer 104. For example, the accessory unit 100 can include one or more panels 106. The panels 106, which may include fiberglass, steel, carbon fiber, plastic, or other relatively rigid materials in some embodiments, can be configured to define the structure of the segments 202 of the front flap 200. In turn, the areas between the panels 106 can define the folding regions 204 of the front flap 200, with the inner layer 102 and the outer layer 104 providing the folding regions with flexibility.

The accessory unit 100 can further include one or more magnetic elements in the front flap 200. In one embodiment, one or more magnetic elements 108 can be configured to interact with an attachment feature of a consumer electronic device received in rear cover 300. For example, the magnetic elements 108 can be magnetically attracted to the attachment feature of the consumer electronic device when the accessory unit 100 is in a closed configuration such that the front flap 200 is releasably retained in this configuration. The front flap 200 can further include a magnetic element 110 configured to interact with a magnetically sensitive sensor configured to detect presence, absence, or a change from presence to absence or vice versa of the magnetic element. For example, the magnetically sensitive circuit can include a Hall Effect sensor.

As an example, the Hall Effect sensor can respond to the presence (or absence) of a magnetic field by generating a signal. The signal can be used to alter an operating state of the electronic device. Accordingly, magnetic element 110 can be positioned on front flap 200 in a location that triggers the Hall Effect sensor to generate the signal when the cover is placed on or in proximity to a surface of the consumer electronic device. The signal can indicate that the front flap 200 is in a predetermined position relative to the consumer electronic device that can result in a change in an operating state of the consumer electronic device. For example, with a portion of front flap 200 having magnetic element 110 in proximity to the Hall Effect sensor, the magnetic field from magnetic element 110 can cause the Hall Effect sensor to generate a signal. The signal can, in turn, be used to alter the operating state to one consistent with functioning of the consumer electronic device being fully covered.

For example, in those situations where the consumer electronic device includes a display, the functioning of the consumer electronic product can be altered in such a way that the display is prevented from displaying visual content. On the other hand, when the portion of front flap 200 having magnetic element 110 is removed to the point where the Hall Effect sensor no longer responds to the magnetic field of magnetic element 110, then the Hall Effect sensor can generate another signal. The other signal can result in the consumer electronic device entering another, different, operating state consistent with at least a portion of the display being uncovered and viewable. As with the example of the consumer electronic product having a display, when the Hall Effect sensor no longer detects the magnetic field from magnetic element 110, then the functioning of the tablet computer can be altered such that the display is enabled to present visual content.

The accessory unit 100 can further include one or more end panels 112 between the inner layer 102 and the outer layer 104, which can be configured to define the structure of a portion of the end region 206 at the end segment 208. The end panels 112 can include fiberglass, steel, carbon fiber, plastic, or other relatively rigid materials in some embodiments. Accordingly, the material(s) defining the inner layer 102 and the outer layer 104 (e.g., microfiber, leather, or any other suitable material) can include flexible materials that allow the front flap 200 to flex at the folding regions 204 and at the end region 206, whereas the material(s) defining the panels 106 can provide rigidity and stiffness. In some embodiments, the front flap 200 can also include a reinforcement bar 114. The reinforcement bar 114 can be configured to reinforce the outer edge 210c of the front flap 200 and the corners between the outer edge and the side edges 210a and 210b of the front flap 200. Accordingly, the reinforcement bar 114 can be formed from a relatively rigid material such as plastic, steel, carbon fiber, fiberglass, etc.

The accessory unit 100 can also include shell 118. Shell 118 can be positioned between inner layer 102 and outer layer 104 in the area of rear cover 300, and can provide stiffness to rear cover 300. Shell 118 can be formed from a variety of materials, including thermoplastics, composites, and the like. In the described embodiments, shell 118 can be formed primarily of Glass Fiber Reinforced Plastic (GFRP) that is also referred to as more simply fiberglass. GFRP is a fiber reinforced polymer made of a plastic matrix reinforced by fine fibers of glass. It should be noted that the plastic matrix used to form many GFRP structures can be a thermosetting plastic (most often epoxy, polyester or vinyl ester) or thermoplastic. Moreover, GFRP is a lightweight, extremely strong, and robust material and has bulk strength and weight properties that compare favorably to metals and yet, unlike metals, is RF transparent. In this way, GFRP has properties that make it a good candidate for a structural element that is strong, resilient and yet is also RF transparent. This combination is particularly desirable when accessory unit 100 is used in conjunction with consumer electronic products that use RF communication circuitry.

In addition, shell 118 can include a variety of openings configured to provide access to various buttons, camera holes, speaker ports, etc. In some embodiments, speaker cover 116 can be included between shell 118 and inner layer 102 or outer layer 104, including perforations to allow sound to escape from speakers included in the electronic device. Shell 118 can be attached to inner layer 102 and outer layer 104 using a variety of adhesives. In one embodiment, a heat activated adhesive can be used to attach both inner layer 102 and outer layer 104 to shell 118. However, any technically feasible adhesive can be used to form a reliable connection. Lip 304 can be provided around a periphery of shell 118 to provide structural stiffness to rear cover 300 and an overhang for retention of the electronic device. In some embodiments, lip 304 can be integrated into shell 118. In other embodiments, lip 304 can be formed as a separate component and attached to shell 118 during an assembly process. More detail regarding lip 304 and the interface between lip 304 and shell 118 are described below.

The front flap 200 can include inner and outer adhesive layers 120 and 122 that bond the layers of material defining the front flap together. In particular, the outer adhesive layer 120 can bond the outer layer 104 to the reinforcement bar 114 and the panels 106 and the end panel 108. Further, the inner adhesive layer 120 can bond the inner layer 102 to the reinforcement bar 114, the panels 106, and the end panel 112. Accordingly, the adhesive layers 120 and 122 can laminate the layers and components comprising the front flap 200 together.

In some embodiments the adhesive layers 120 and 122 can comprise a thermoplastic adhesive, such as a thermoplastic urethane adhesive, or a thermoplastic nylon adhesive. Such thermoplastic adhesives can act to form a structural element providing shape to inner layer 102 and outer layer 104 which on their own would not hold a solid shape. In this regard, thermoplastic adhesives can be melted in order to glue together multiple layers of material (e.g., inner layer 102 and outer layer 104). By varying the temperature at which the thermoplastic adhesives are heated, the pressure at which the operation takes place, the length of time the thermoplastic adhesives are exposed to the heat, and the temperature to which the thermoplastic adhesives are cooled after heating, the rigidity of the structure defined thereby can be controlled. For example, in one embodiment, as the thermoplastic adhesive melts the adhesive can seep into adjacent porous layers of material, forming a bonded structure. Longer periods of heating can result in increased infusion into the material and can create a more rigid structure.

In some embodiments, the flexibility of front flap 200 can also be controlled by locally thinning regions of inner layer 102 and outer layer 104. This can be particularly important when inner and outer layers 102 and 104 are formed from a relatively stiff material such as leather. In one embodiment, the local thickness of layers 102 and 104 can be reduced by running an abrasion tool such as a horizontal sanding wheel along a non-visible surface of layers 102 and 104 in regions 204 prior to assembly. In other embodiments, the same effect can be achieved using a laser or splitting machine.

Furthermore, some embodiments of accessory unit 100 can include features configured to retain flexibility of the end region 206 of the front flap 200. In the embodiment of the accessory unit 100 illustrated in FIG. 3, the inner and outer adhesive layers 120 and 122 of the front flap 200 may not completely cover the end region 206. Rather, as illustrated, the inner and outer adhesive layers 120, 122 can include tab 122' that extends across the end region 206 proximate the side edges 210a and 210b of the front flap 200. In particular, tab 122' can be configured to extend across the end region 206 of the front flap 200 to the edge of the rear cover 300. Accordingly, in embodiments in which the front flap 200 includes multiple layers of material, the layers of the material can be bonded at first and second longitudinal ends 206a and 206b of the end region 206 and decoupled therebetween due to tab 122' bonding the longitudinal ends of the end region. By bonding only a portion of the end region 206, the inner layer 102 and the outer layer 104 may remain free to pivot with respect to each other. Thus, the end region 206 can function as a hinge as previously described. Other embodiments of the hinge between front flap 200 and rear cover 300 are described below.

Figure 4A:
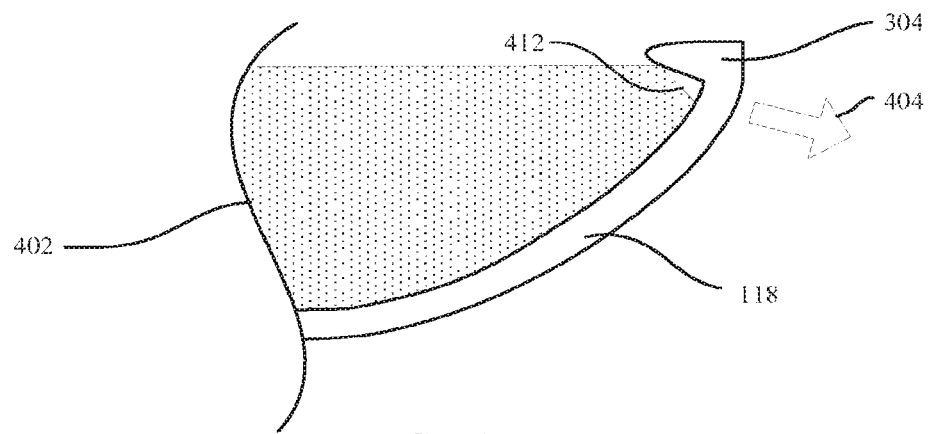
FIG. 4A shows a cross-sectional view of the shell and lip of the rear cover.

FIG. 4A shows a cross-sectional view of shell 118 and lip 304, demonstrating how lip 304 can retain electronic device 402 within accessory unit 100. The materials used for forming shell 119 and lip 304 can be chosen to provide rear cover 300 with mechanical properties sufficient to securely retain electronic device 402 within rear cover 300, while at the same time retaining enough flexibility to allow electronic device 402 to be inserted and removed numerous times without undue exertion by an end-user or potentially damaging accessory unit 100 or electronic device 402. In order to insert and remove electronic device 402, both shell 118 and lip 304 can deflect outwards in direction 404. In one embodiment, electronic device 402 can include chamfer 412 around a periphery of an upper surface. When this is the case, the shape of shell 118 and lip 304 can be configured to provide two points of contact at both edges of the chamfer. The result of this two point engagement is a "snap" experience when electronic device 402 is fully engaged within rear cover 300. This snap can provide an enhanced user experience and assist in alerting the user that electronic device 402 is fully retained within rear cover 300.

In one embodiment, shell 118 and lip 304 can be formed from the same material. The material used can include thermoplastics, fiber reinforced plastics, polymers, and the like. However, there can be several disadvantages to forming both shell 118 and lip 304 from the same material. First, it can be difficult to locate a material that possesses the mechanical properties necessary to protect and hold in place electronic device 402 while simultaneously having the flexibility to allow electronic device 402 to be easily inserted and removed. Second, the undercut formed by lip 304 can complicate the molding process when shell 118 and lip 304 are formed as a single part, necessitating the use of sliders or other moving parts in the mold.

Figure 4B:
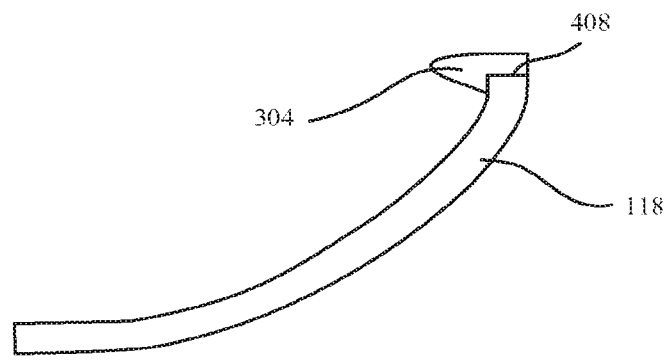
FIG. 4B shows a cross-sectional view of the shell with a separate lip component.

The above mentioned difficulties can be removed by forming shell 118 and lip 304 from different materials. FIG. 4B shows an alternative embodiment in which shell 118 and lip 304 are made from different materials and joined during an assembly process. For example, shell 118 can be formed from a glass-fiber reinforced plastic while lip 304 can be formed from a thermoplastic material. The combination of different materials can provide a satisfactory combination of mechanical strength and flexibility to both protect electronic device 402 and allow for easy insertion and removal. In one embodiment, the resin used in shell 118 can be closely matched to the thermoplastic used in lip 304, such that both resins can cure simultaneously and form a bond along surface 408. More detail regarding this process is shown in FIG. 6.

Figure 4C:
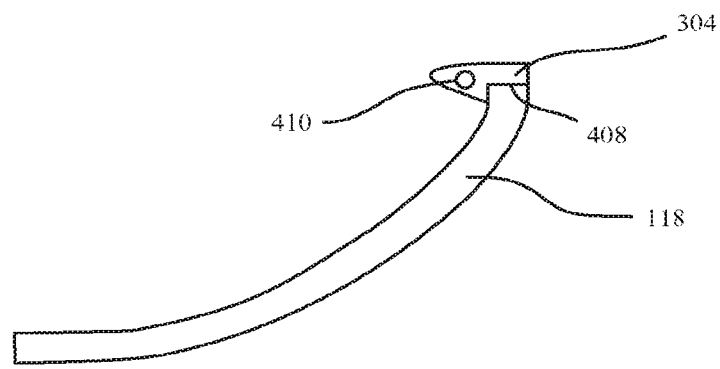
FIG. 4C shows a cross-sectional view of the shell and lip of the rear cover with an added fiber reinforcement in the lip portion.

FIG. 4C shows yet another embodiment of shell 118 and lip 304. Similar to the embodiment shown in 4B, shell 118 and lip 304 can be formed from separate materials. For example, shell 118 can be formed from a glass-fiber reinforced plastic while lip 304 can be formed from a thermoplastic. However, lip 304 can also include one or more strands of fiber 410 along the length of lip 304. The added fibers can increase the rigidity of lip 304. Fibers 410 can be selected from a number of fibers including Kevlar, glass fibers, carbon fibers, and the like. In one embodiment, fiber 410 can be introduced in the assembly during the curing process for shell 118 and lip 304, allowing all three components to cure simultaneously. In other embodiments, fiber 410 can be added to an outer surface of lip 304 after lip 304 has been cured. In this case, fiber 410 can be attached to lip 304 using adhesives, solder, or any other technically feasible means. An apparatus for inserting fiber 410 into lip 304 during the curing process is shown in FIG. 5 and a process for including fiber 410 is described in FIG. 7.

Figure 5:
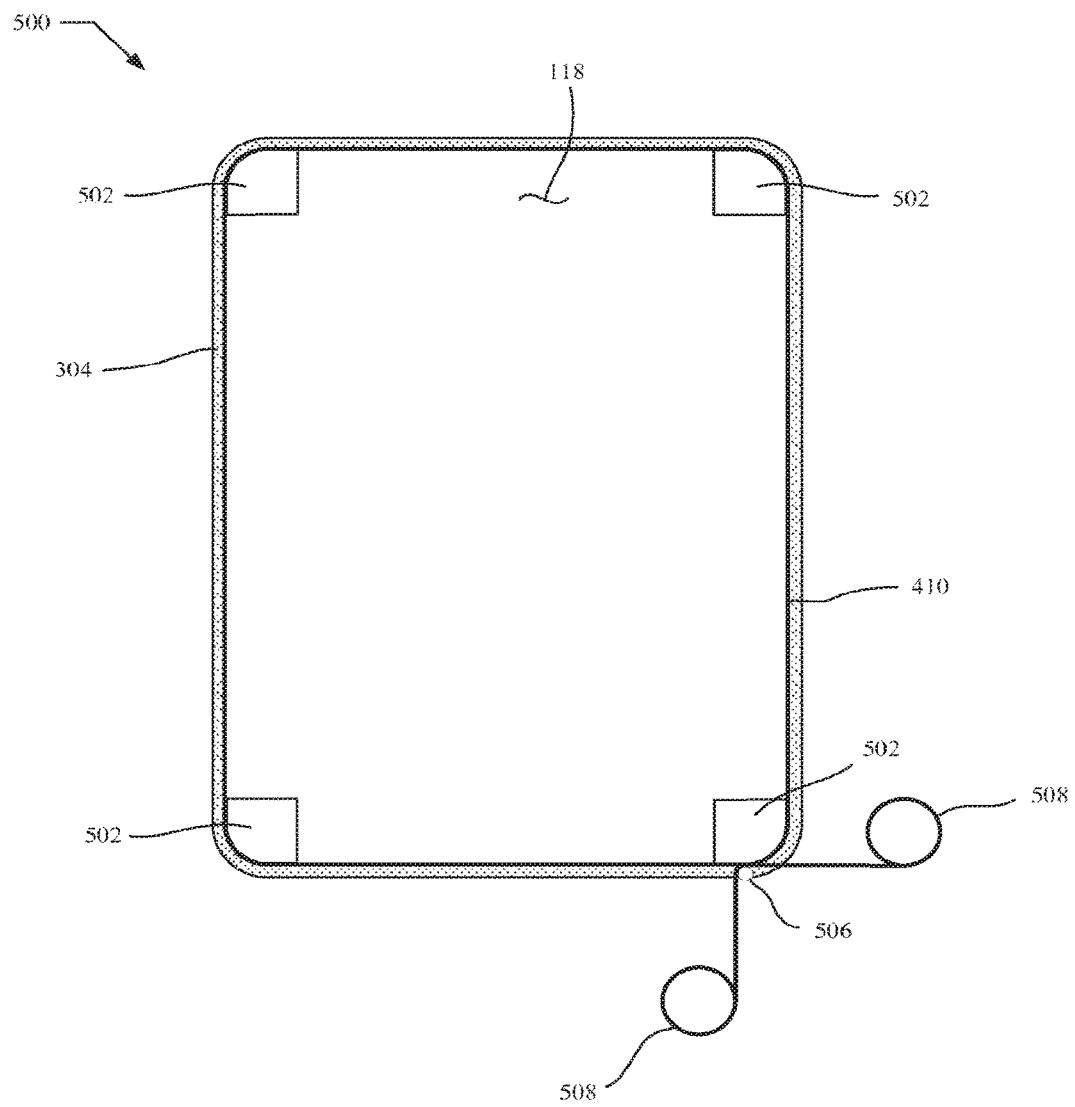
FIG. 5 shows an apparatus for placing a fiber in the lip portion during the curing process.

FIG. 5 shows apparatus 500 for including fiber 410 in lip 304 during the curing process. Shell 118 can placed in a mold and an over-mold for forming lip 304 can be placed over shell 118. Corner guides 502 can be placed along interior corners of lip 304 and fiber 410 can be wrapped around an outer surface of the corner guides 502. Pegs 506 and 508 can be used to direct fiber 410 away from apparatus 500 and tighten fiber 410 until it is taut. The combination of corner guides 502 and pegs 506 and 508 can hold fiber 410 in place while lip 304 is cured. As a result, fiber 410 becomes an integral part of lip 304 and can greatly increase the rigidity of lip 304.

Figure 6:
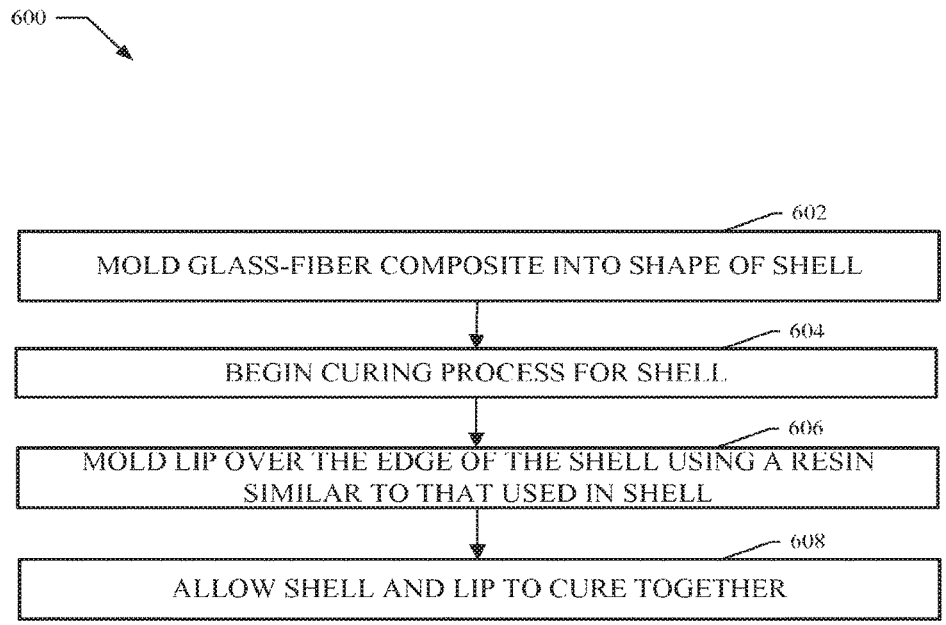
FIG. 6 shows a flow chart depicting a process for molding a lip onto a shell.

FIG. 6 shows a flow chart depicting process 600 for simultaneously curing a shell and a lip for an accessory unit. In step 602, a glass-fiber reinforced composite can be molded into the shape of the shell. In other embodiments, the shell can be molded from other materials such as thermoplastics. The resin used in the molding process can either be added at this time or be pre-impregnated in the fibers. In still other embodiments, fibers other than glass can be used in the composite framework, including Kevlar, carbon fiber, and the like. Next, in step 604, the curing process for the shell can begin. This can include heat, time, UV-curing, or any other technically feasible means of curing. While the curing process for the shell is still in progress, in step 606, the lip can be molded over the edge of the shell. The lip can be formed using a resin or thermoplastic with properties similar to the resin used in the shell. This can ensure that a strong bond is formed between the shell and lip. Finally, in step 608, the shell and lip can be allowed to cure together and form one part.

Figure 7:
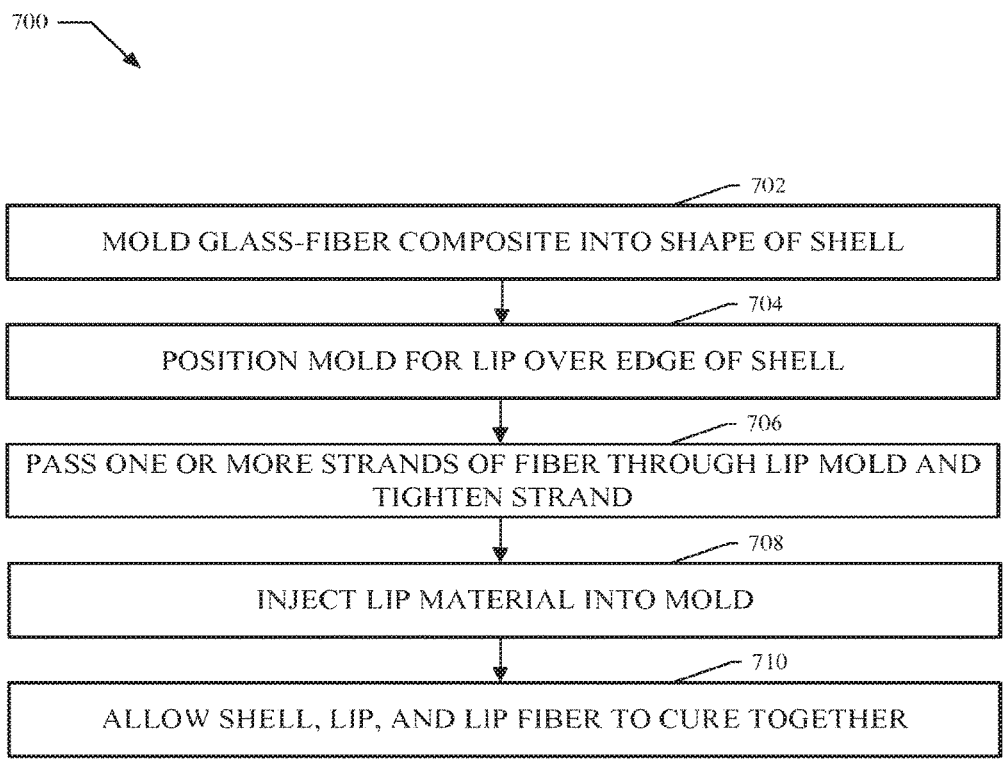
FIG. 7 shows a flow chart depicting a process for molding a lip onto a shell with a fiber held within the lip.

FIG. 7 shows a flow chart depicting process 700 for including one or more strands of fiber in the lip of the rear cover. In step 702, a glass-fiber reinforced composite can be molded into the shape of the shell. In other embodiments, the shell can be molded from other materials such as thermoplastics. The resin used in the molding process can either be added at this time or be pre-impregnated in the fibers. In still other embodiments, fibers other than glass can be used in the composite framework, including Kevlar, carbon fiber, and the like. Next, in step 704, an over-mold for forming the lip can be positioned over the edge of the shell. Then, in step 706, one or more strands of fiber can be passed through the mold for the lip and tightened. In some embodiments, an apparatus with corner guides and tightening pegs such as the apparatus depicted in FIG. 5 can be used to align the fibers properly within the mold. Next, in step 708, the lip material can be injected into the lip mold. The lip material can include a resin or thermoplastic with properties similar to the resin used in the shell. Finally, in step 710, the shell, lip, and fiber strands can be allowed to cure together and form one unified part.

Figure 8A:
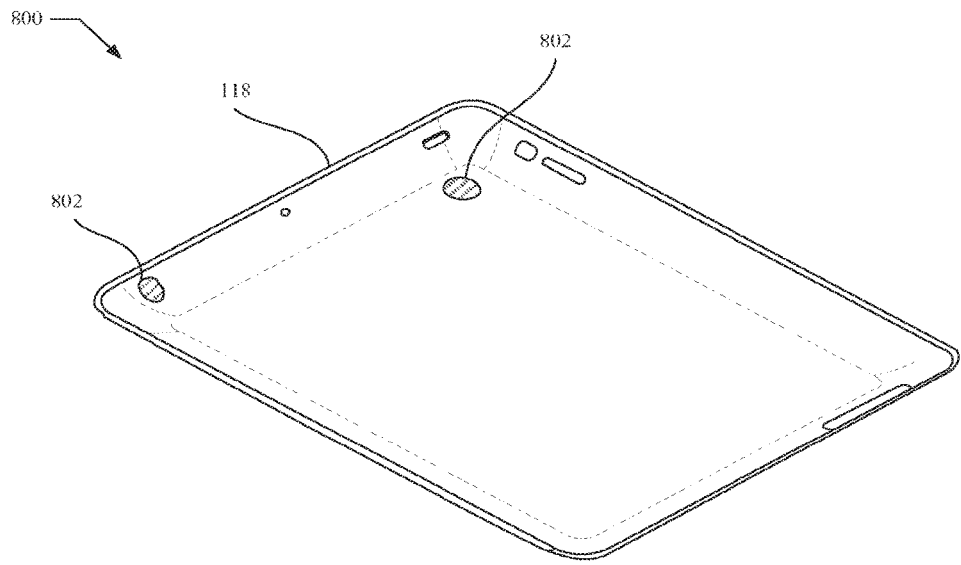
FIG. 8A shows a perspective view of a shell with several blind holes for openings.

FIG. 8A shows shell assembly 800, demonstrating a method for creating through holes in accessory unit 100 while minimizing the degree to which the shell is visible to the user. Accessory unit 100 can include a variety of through openings allowing the electronic device to be exposed to the outside environment in limited areas. These can include openings for cameras, headphone jacks, speakers, microphones and the like. If these openings are created through inner layer 102, shell 118, and outer layer 104, then a significant portion of shell 118 can be visible to the user around an interior of the opening. Often times, shell 118 can be a different color than inner layer 102 and outer layer 104, resulting in an opening that is not aesthetically pleasing.

Figure 8B:
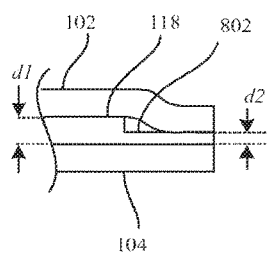
FIG. 8B shows a cross-sectional of the shell of FIG. 8A.
Figure 8C:
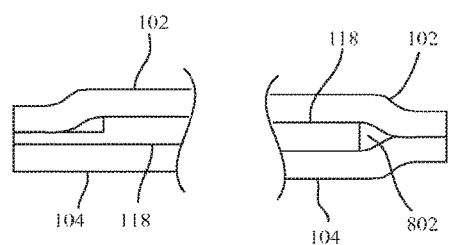
FIG. 8C shows a cross-sectional of the shell of FIG. 8A.

FIGS. 8A-8C demonstrate how this discontinuity can be minimized or eliminated. Areas 802 can represent regions in which through holes are needed for a camera, headphone jack, or other type of opening. Shell 118 can be drilled or machined to create a blind hole in these regions. For example, if the total thickness of shell 118 is approximately 0.4 mm, regions 802 can be machined down to a thickness of 0.2 mm. It should be noted that these numbers are representative and any percentage of the thickness of shell 110 can be removed during this process.

Referring to FIG. 8B, a cross-sectional view of region 802 is shown after inner layer 102 and outer layer 104 have been affixed and the through hole has been cut. Inner layer 102 can follow the contour of shell 118 as the thickness is reduced from the normal thickness to that of the blind hole. As such, the visible portion of shell 118 is decreased from distance d1 to distance d2. Often times, this reduction can reduce the thickness of shell 118 to the point where it is not visible to the human eye upon casual inspection of accessory unit 100. FIG. 8C shows another embodiment in which a through hole is used in place of a blind hole in regions 802. In this case, inner layer 102 and outer layer 104 are bonded directly to each other in the area surrounding the final through hole. This method can ensure that shell 118 is completely invisible to the user, but offers less structural support around the opening. For this reason, the technique shown in FIG. 8B is preferable when used around openings in higher stress areas of accessory unit 100.

Figure 9:
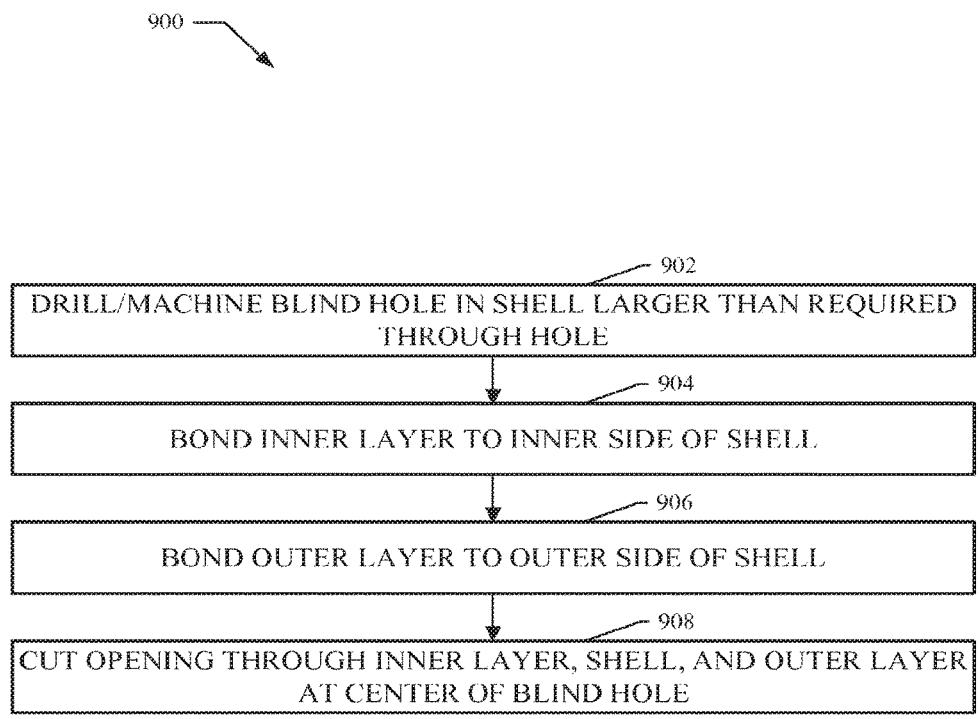
FIG. 9 shows a flow chart depicting a process for creating a hole through an accessory unit while displaying a minimal amount of shell.

FIG. 9 shows a flow chart depicting process 900 for minimizing an amount of visible shell in an opening through an accessory unit. In step 902, a blind hole is drilled or machined in an area where an opening is desired. The blind hole should be larger than the desired opening. Preferably, the blind hole should be placed on a non-visible side of the accessory unit. However, the hole can be placed on either side if so desired. The depth of the hole can be approximately half the thickness of the shell or any other suitable depth. Next, in steps 904 and 906, the inner and outer layers are bonded on both surfaces of the shell. Finally, in step 908, the desired opening is cut through the inner layer, shell, and outer layer at the center of the blind hole. The reduced thickness of the shell around the periphery of the opening can make the appearance of the opening more aesthetically pleasing to the user.

Figure 10A:
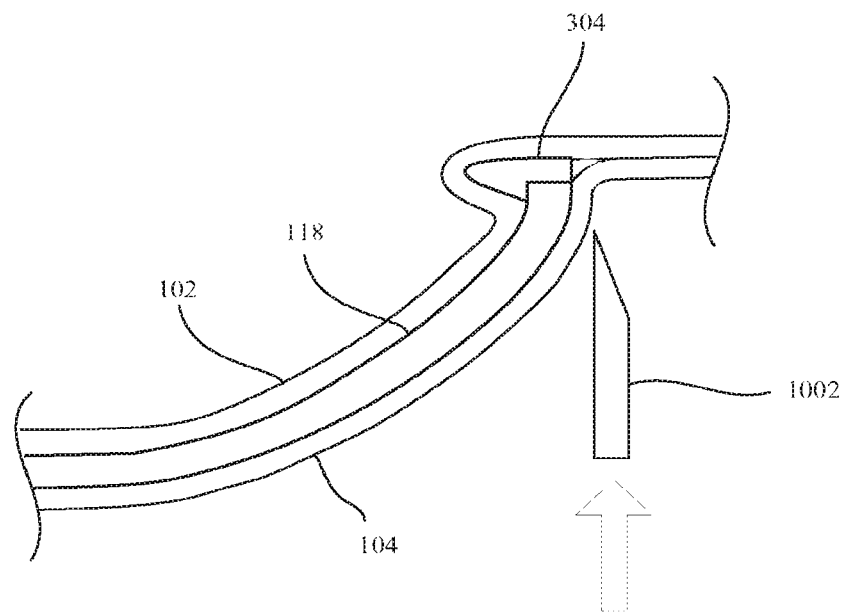
FIG. 10A illustrates a process for trimming an excess amount of covering material from an accessory unit.
Figure 10B:
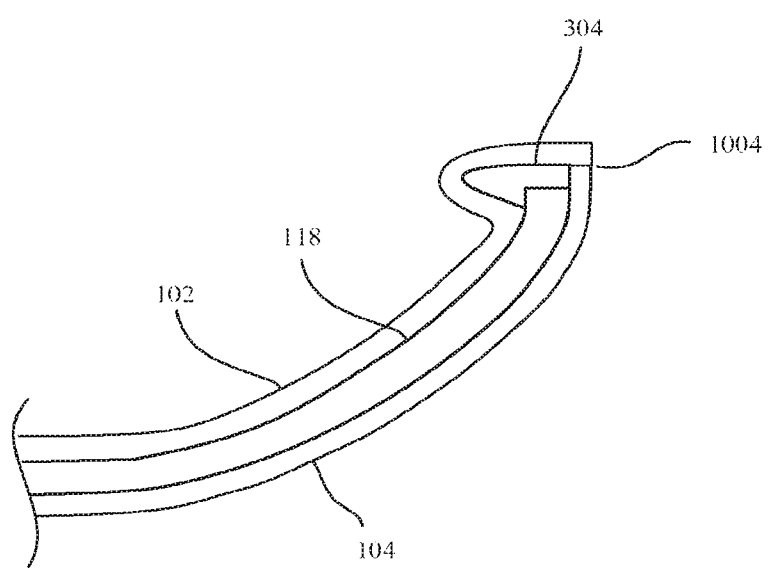
FIG. 10B shows a cross-sectional view of a shell with inner and outer layers bonded and trimmed.

FIGS. 10A and 10B show a cross-sectional view of accessory unit 100 as inner layer 102 and outer layer 104 are applied to shell 118 and lip 304. In some embodiments, inner layer 102 and outer layer 104 can make up one piece of material that wraps around the entirety of accessory unit 100 and meets along one seam. Inner and outer layers 102 and 104 can be formed from a variety of different fabrics and materials. Preferably, layers 102 and 104 can be formed low recovery or "high set" fabrics that tend to remain in a deformed state when they are stretched to form around the contours of an object such as accessory unit 100. In addition, it can be preferable to use fabrics that bond well with adhesives. In some embodiments, a primer can be placed on either shell 118 or inner and outer layers 102 and 104 to increase the stiction of the bond between the two.

Inner layer 102 and outer layer 104 can be bonded using any suitable adhesive. In one embodiment, thermoplastic adhesives can be used. However, the use of thermoplastic adhesives can be problematic with some materials due to the high heat needed to cure thermoplastic adhesives. For example, the temperatures needed to cure a thermoplastic adhesive can damage some forms of leather and polyurethanes. In another embodiment, thermosetting glues can be used in place of thermoplastic adhesives. Thermosetting glues can cure at temperatures as low as 80 degrees F. and can therefore be more appropriate for use with temperature sensitive materials. As is shown in FIG. 10A, an excess amount of material can be left after inner layer 102 and outer layer 104 are bonded to shell 118 and lip 304. The excess material can be removed using diecut 1002 to leave seamless finish 1004 shown in FIG. 10B. In one embodiment, diecut 1002 can consist of a machined, single sided blade with tolerances sufficient to ensure that a precise cut is made. However, any suitable method for cutting material can be used to trim excess material from inner layer 102 and outer layer 104.

Figure 11A:
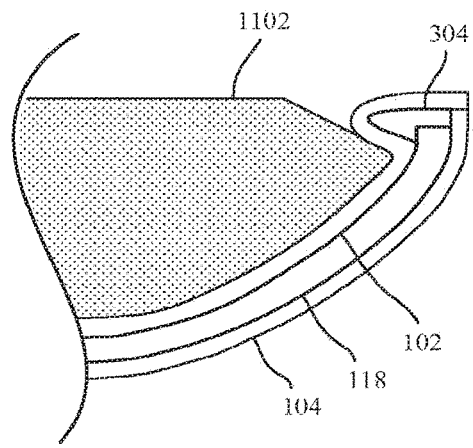
FIG. 11A illustrates a process for curing an adhesive using a plug.
Figure 11B:
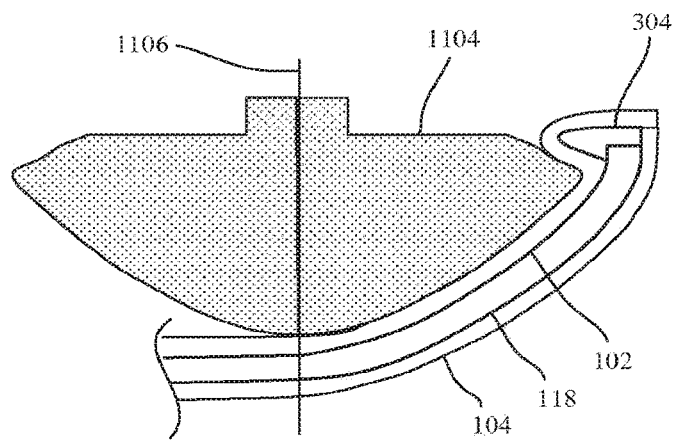
FIG. 11B illustrates a process for curing an adhesive using a rolling heater.
Figure 11C:
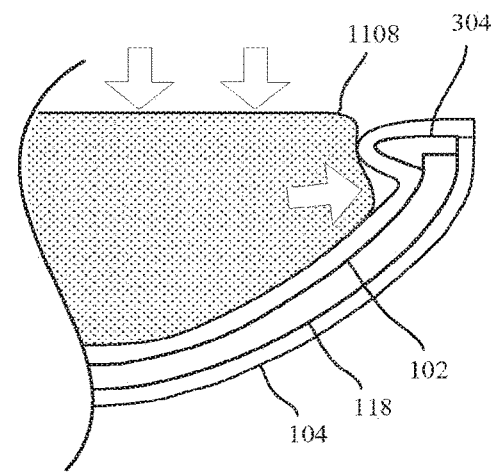
FIG. 11C illustrates a process for curing an adhesive using a deformable plug.

FIGS. 11A-11C demonstrate methods for curing thermosetting glue around an edge region of rear cover 300. One problem that can arise when bonding inner layer 102 to shell 118 and lip 304 is maintaining sufficient pressure and heat underneath the overhang formed by lip 304 while the adhesive is curing. FIG. 11A demonstrates one method of solving this problem using a heated plug 1102 during the curing process. Plug 1102 can have a shape similar to that of the electronic device accessory unit 100 is designed to accommodate and be formed from a thermally conductive material such as steel, metal, or brass. The combination of heat and pressure under lip 304 can allow inner layer 102 to firmly adhere to shell 118 and lip 304.

FIG. 11B shows an alternative method of providing heat and pressure using a rotating fixture 1104. Fixture 1104 has a shape configured to conform to the interior of shell 118 and lip 304. In addition, fixture 1104 can rotate about axis 1106 and translate around a periphery of shell 118, providing intermittent pressure and heat during the curing process. Finally, FIG. 11C demonstrates yet another method of creating pressure under lip 304. Deformable material 1108 can be placed within the cavity formed by shell 118. Deformable material 1108 can be any material capable of deforming in response to pressure such as silicon. Once in place, pressure can be applied along a top surface of deformable material 1108, causing the portion of deformable material 1108 within shell 118 to expand outwards and fill any crevices. This outward pressure can hold inner layer 102 in place against shell 118 and lip 304 during the curing process.

Figure 12A:
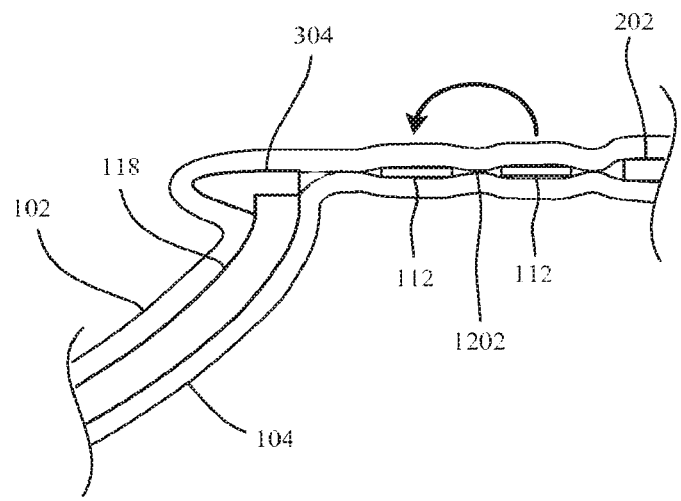
FIG. 12A shows a cross-sectional view of a hinge mechanism utilizing two rigid stiffeners.
Figure 12B:
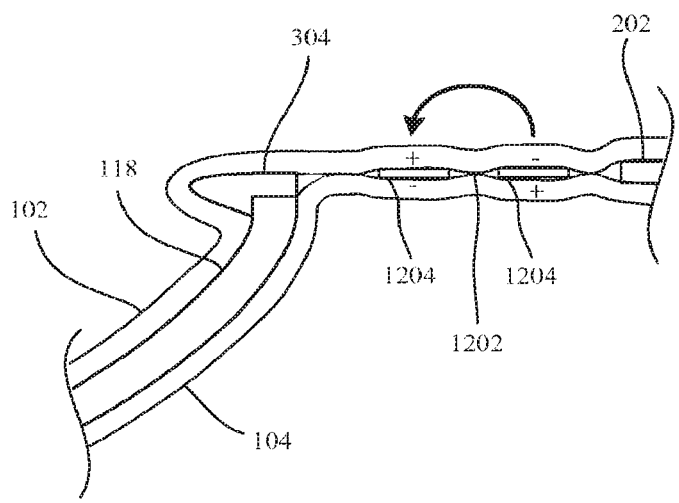
FIG. 12B shows a cross-sectional view of a hinge mechanism utilizing magnets.

As noted above, front flap 200 can be hingedly coupled to rear cover 300. FIGS. 12A and 12B show various embodiments of means for forming an acceptable hinge mechanism. Inner layer 102 and outer layer 104 are formed from flexible materials and can span between front flap 200 and rear cover 300, providing means for front flap 200 to rotate between open and closed positions. However, when left as the only connection between front flap 200 and rear cover 300, inner and outer layers 102 and 104 tend to bend in undesirable directions, causing front flap 200 to misalign with rear cover 300 when in a closed position. Moreover, if inner and outer layers 102 and 104 are overly stiff, front flap 200 can fail to lay flat against rear cover 300 when in a closed position.

To correct these issues, two rigid stiffeners 112 can be included between inner layer 102 and outer layer 104 such that the accessory unit 100 folds between the two rigid stiffeners 112 when placed in the closed position. Rigid stiffeners 112 can be formed from any suitably rigid material, including steel, aluminum, plastics, fabric scrims, and the like. Rigid stiffeners 112 can be held in place by the same adhesive that bonds inner and outer layers 102 and 104 together between rigid stiffeners 112 or any other suitable adhesive. In some embodiments, further flexibility can be added to the hinge system by performing a hot press on inner and outer layers 102 and 104 in region 1202 between the two rigid stiffeners 112. In yet another embodiment, flexibility can be further increased by reducing the thickness of inner and outer layers 102 and 104 in region 1202 using an abrasion tool, laser, or splitting machine prior to assembly. FIG. 12B shows another embodiment in which rigid stiffeners 112 are replaced by magnets 1204. Magnets 1204 can be placed with reversed polarities such that the magnets 1204 attract each other when rotated into the closed position as shown by the arrow. The addition of magnets 1204 can further ensure that front flap 200 lays flat against the electronic device when placed in the closed position.

Figure 13A:
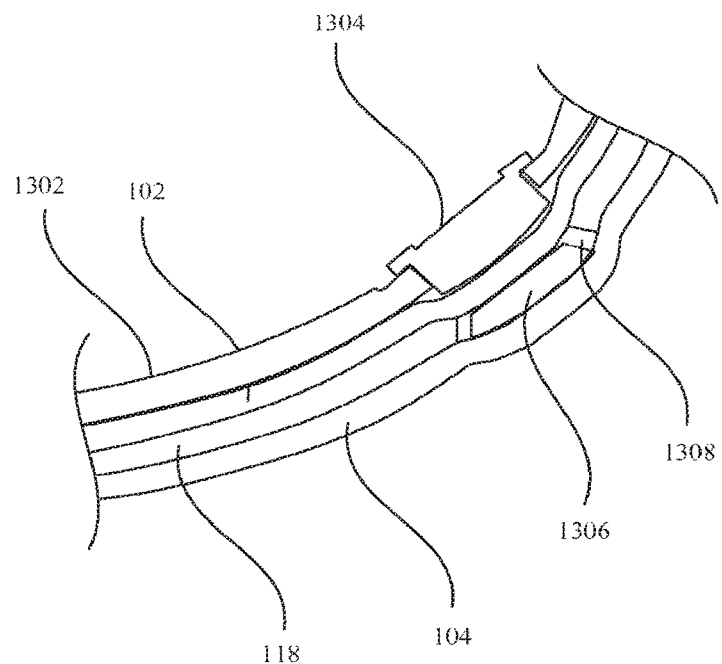
FIG. 13A shows a cross-sectional view of a button assembly using a rigid filler to depress a button.
Figure 13B:
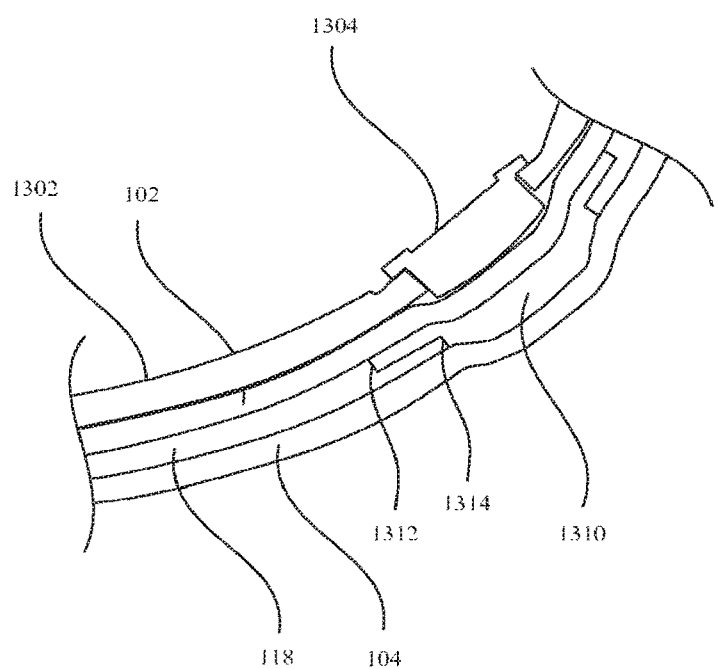
FIG. 13B shows a cross-sectional view of a button assembly using an over-molded outer button to depress a button.

FIGS. 13A and 13B demonstrate multiple embodiments for allowing a user to access buttons on the electronic device through accessory unit 100 without the need for a through hole. In FIG. 13A, electronic device 1302 includes button 1304 that can be accessed by the user without removing electronic device 1302. The shown portion of rear cover 300 includes inner layer 102, outer layer 104, and shell 118. Chamfered opening 1308 can be created in shell 118 aligned with button 1304, and the space created by chamfered opening 1308 can be filled with rigid filler 1306 during the assembly process. Rigid filler 1306 can be formed from any suitably rigid material, including aluminum, steel and plastic. When the user depresses outer layer 104 above button 1304, the force is transferred through outer layer 104 to rigid filler 1306. Rigid filler 1306 then transfers the force through inner layer 102 and depresses button 1304.

FIG. 13B demonstrates another embodiment providing access to button 1304 on electronic device 1302. Similar to FIG. 13A, the shown portion of rear cover 300 includes inner layer 102, outer layer 104, and shell 118. However, shell 118 contains through hole 1314 surrounded by blind hole 1312, where blind hole 1312 is larger than through hole 1314. The thinned section of shell 118 created by blind hole 1312 can be used as a bonding area to over-mold outer button 1310. Outer button 1310 can be formed from any compression moldable material capable of forming a button shape such as silicon. In other embodiments, a hard filler can also be embedded in the over-molded material similar to the embodiment described in FIG. 13A. When the user presses on outer layer 104, the force is transferred through outer button 1310 and inner layer 102 to depress button 1304.

Figure 13C:
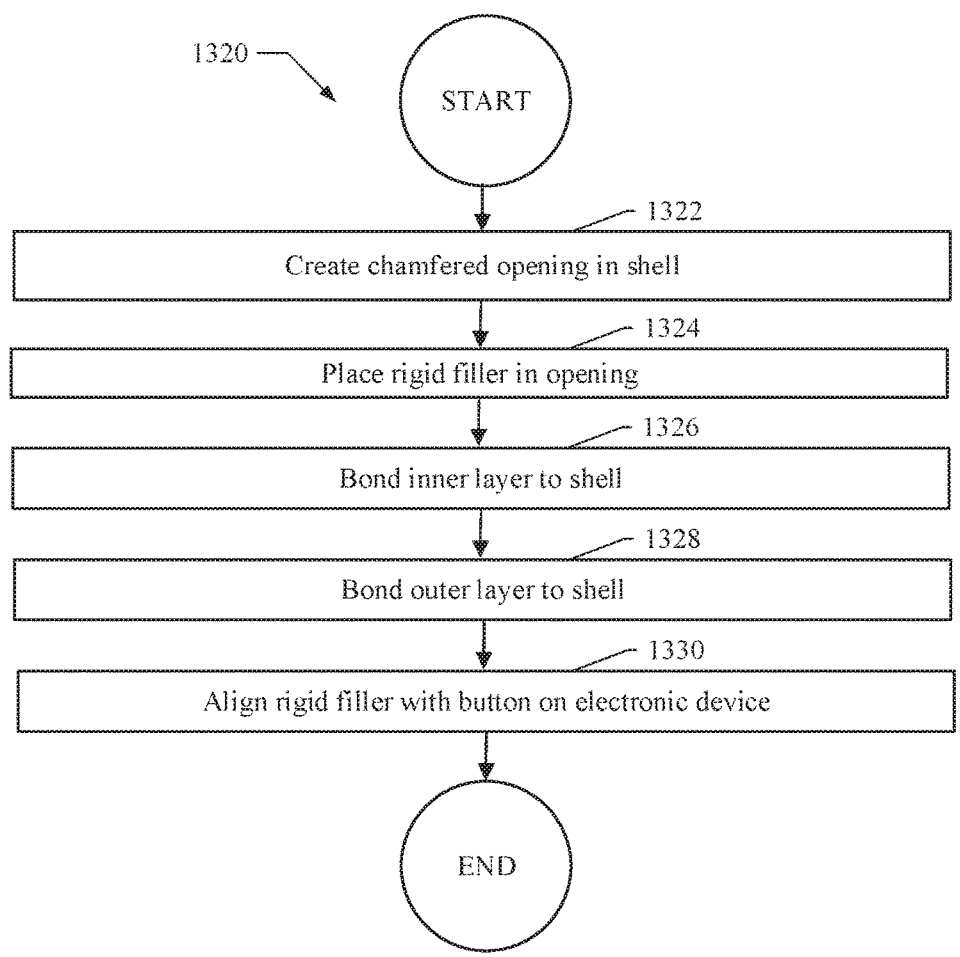
FIG. 13C shows a flow chart depicting a process for creating a button assembly.

FIG. 13C shows a flow chart depicting process 1320 for creating a button assembly along the lines of FIG. 13A. In step 1322, a chamfered opening is created in a shell. The opening can be circular or any other feasible shape. Preferably, the opening can have a shape roughly equal to that of the button on the electronic device that the button assembly is configured to depress. In step 1324, a rigid filler is placed within the chamfered opening. The rigid filler can have a chamfered edge as well, with the sides aligned to interlock with the chamfered opening in the shell. In steps 1326 and 1328, inner and outer layers are bonded to the shell. However, adhesives should not be placed between the inner and outer layers and the rigid filler, allowing the rigid filler to move freely within the chamfered opening in the shell. Finally, in step 1330, the rigid filler can be aligned with a button on a corresponding electronic device. When a force is applied to the outer layer, the force can be transferred through the rigid filler and depress the button the electronic device.

Figure 13D:
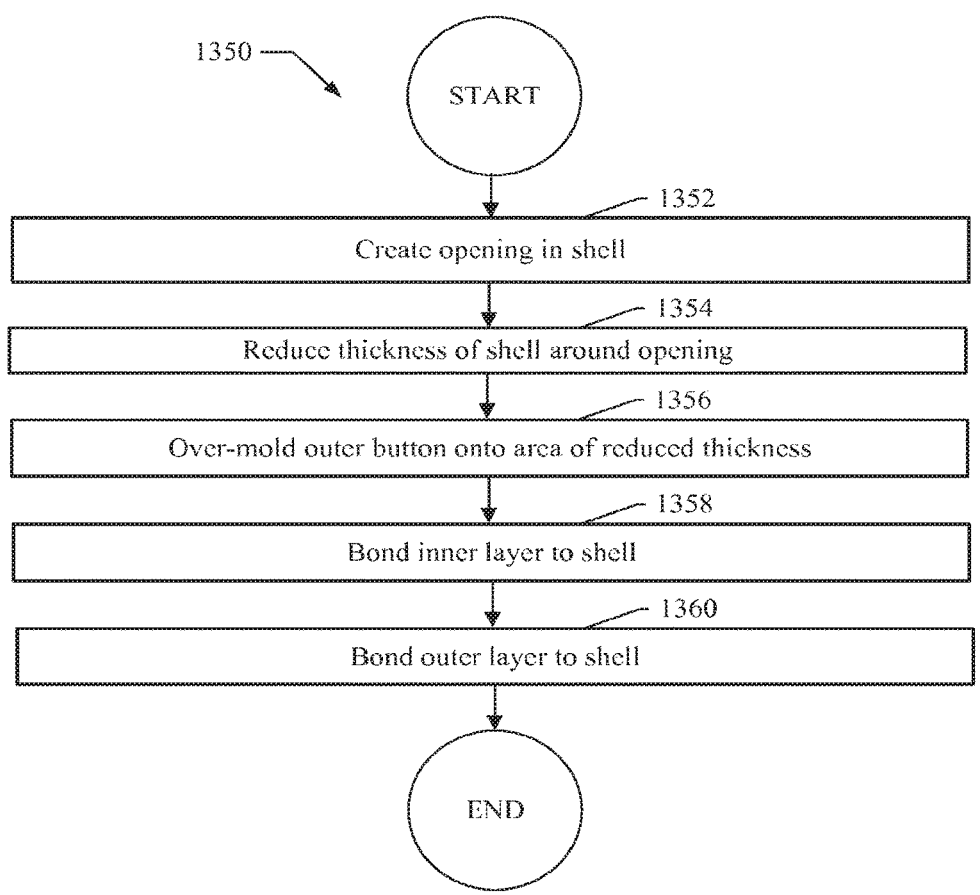
FIG. 13D shows a flow chart depicting a process for creating a button assembly.

FIG. 13D shows a flow chart depicting process 1350 for creating a button assembly along the lines of FIG. 13B. In step 1352, an opening is created in the shell. The opening can be circular or any other feasible shape. Preferably, the opening can have a shape roughly equal to that of the button on the electronic device that the button assembly is configured to depress. In step 1354, the thickness of the shell in a region surrounding the opening can be reduced. The thickness can be reduced through drilling, machining, or any other technically feasible means. Furthermore, the material can be removed from the surface of the shell facing inwards towards the electronic device. Next, in step 1356, an outer button can be over-molded onto the area of reduced thickness created in step 1354. The outer button can include a protruding portion that can protrude through the opening in the shell and project outwards from the electronic device. Finally, in steps 1358 and 1360, the inner and outer layers can be bonded to the shell. When a user depresses the appropriate region of the outer shell, the outer button transfers the resulting force through the inner layer and depresses the corresponding button on the electronic device.

Figure 14:
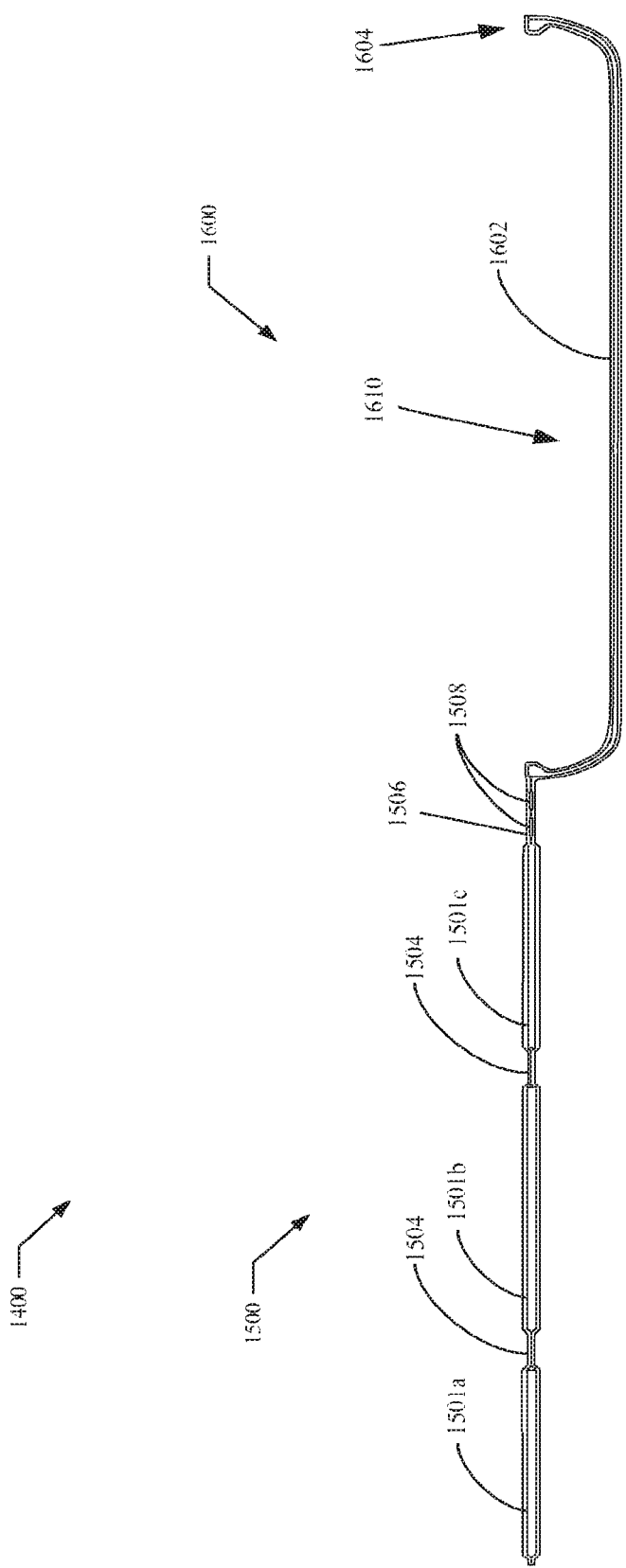
FIG. 14 illustrates a cross sectional view of the accessory unit shown in FIG. 1A in the open configuration.
Figure 15:
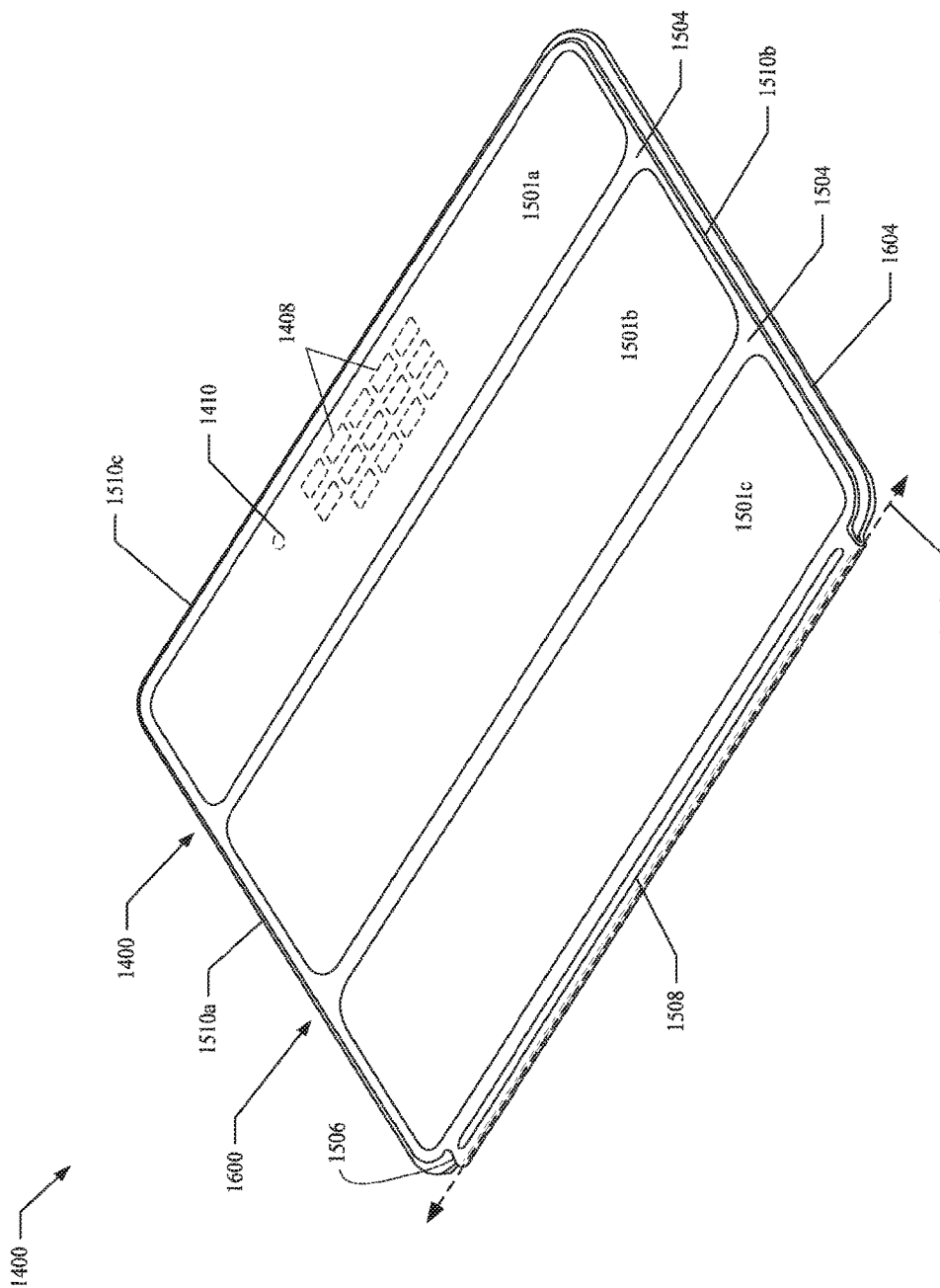
FIG. 15 illustrates a perspective view of the accessory unit of FIG. 14 with the front flap in a closed configuration.
Figure 16:
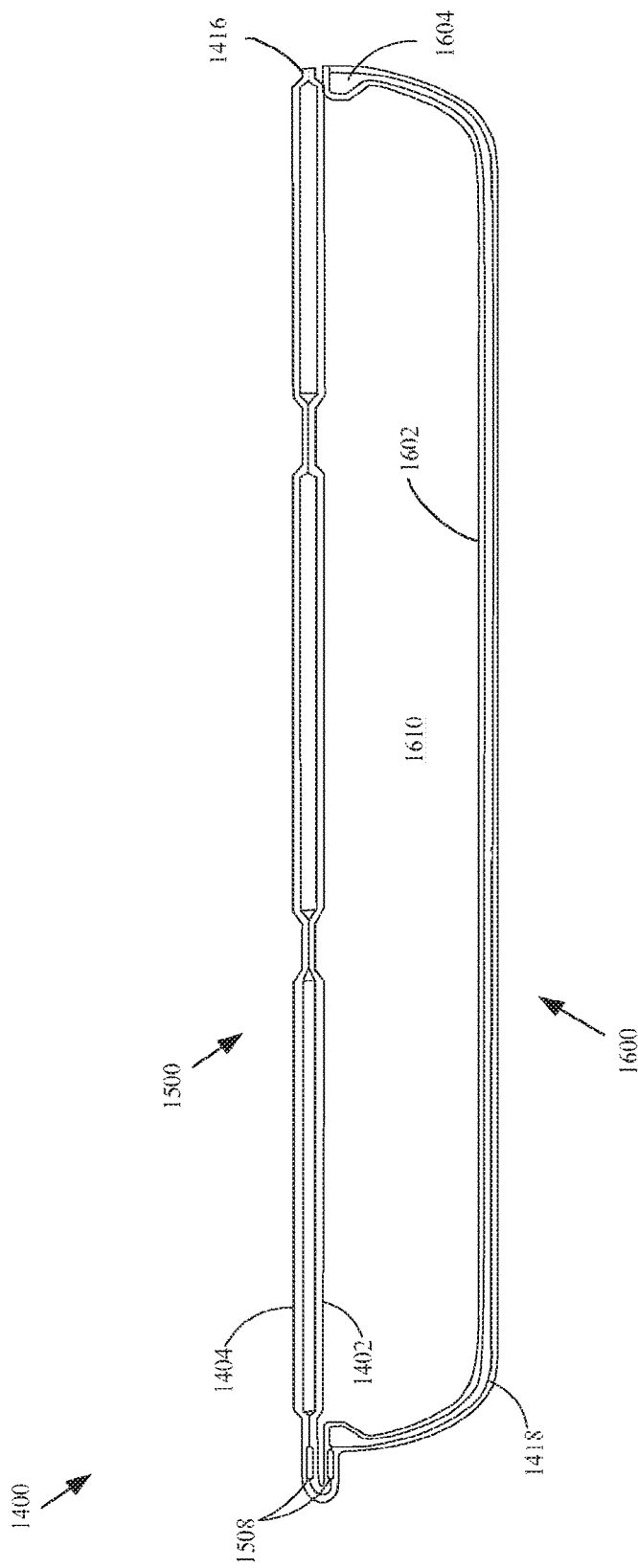
FIG. 16 illustrates a cross sectional view of the accessory unit of FIG. 15 with the front flap in a closed configuration.

FIGS. 14-16 illustrate an embodiment of an accessory unit 1400 according to the present disclosure. As illustrated, the accessory unit 1400 may comprise a front flap 1500 and a rear cover 1600. The front flap qr00 may include a plurality of segments 1501a, 1501b, 1501c and a folding region 1504 positioned between each of the segments. The folding regions 1504 may be configured to allow segments 1502 to fold with respect to each other. The front flap 1500 may also include an end region 1506. The end region 1506 pivotally couples the front flap 1500 to the rear cover 1600.

In some embodiments, each of segments 1501a, 1501b, 1501c can include one or more inserts disposed therein. For example, segments 1501a, 1501b, 1501c can each include a pocket region where the inserts are placed, or alternatively, may be embedded within segments 1501a, 1501b, 1501c (e.g., via insert molding). In embodiments using pockets, the pocket regions have a size and shape to accommodate corresponding inserts. The inserts can have various shapes but are usually shaped to correspond to the overall look of front flap 1500 (e.g., rectangular). The inserts can provide structural support for front flap 1500. That is, the inserts can provide stiffness to the cover assembly. Accordingly, the inserts may be referred to as stiffeners. The inserts can be formed of rigid or semi-rigid material adding resiliency to front flap 1500. Examples of materials that can be used include plastics, fiber glass, carbon fiber composites, metals, and the like. Some inserts can be formed of resilient materials that further accommodate other components such as magnetic elements. Magnetic elements can interact with a magnetic sensor disposed within an electronic device (not shown) associated with accessory unit 1400. Magnetic elements also be arranged to form a magnetic attraction with an attractable magnetic element disposed with at least one insert. In some embodiment, attractable magnetic elements can be formed of steel, or other ferromagnetic material, and take the shape of a thin sheet incorporated within an insert.

Front flap 1500 further includes folding regions 1504 that are thinner segments 1501a, 201b, 201c and do not include the inserts thereby allowing front flap 1500 to fold and make front flap 1500 easier to handle. In one embodiment, segments 1501b, and 1501c can be substantially wider than segment 1501a in size. In this way, a triangular support structure having appropriate angles can be formed by positioning segments 1501a, 1501b, 1501c in a manner described in U.S. patent application entitled, "CONSUMER ELECTRONIC PRODUCT" by Lauder et al. filed Dec. 17, 2010, having application Ser. No. 12/971,536, now U.S. Pat. No. 8,344,836, which is incorporated herein by reference in its entirety.

One approach to forming at least one triangular support structure can include segment 201a having a plurality of magnets and arranged to fold with respect to segments 1501b and 1501c in such a way that at least one magnetic element within segment 1501a is magnetically attracted to a magnetically active element within segment 1501c. In this way, segments 1501a and segment 1501c can be magnetically bound together forming a first triangular support structure. The triangular support structure can be used as a support structure for accessory unit 100. Accordingly, any electronic component supported by accessory unit 1400 can also be supported. For example, when used as a support, an electronic device having a display and supported by accessory unit 1400 can be placed in such a way that visual content can be displayed at about 75 degrees in relation to a horizontal surface below accessory unit 1400. In another example, front flap 1500 can be folded to form a second triangular support structure that can be used to position the electronic device in an orientation suitable for using the electronic device as a keyboard. It should be noted, however, that these are only representative examples of many other support structures that can be formed by front flap 1500.

While the flexible material of end region 1506 allows it to pivotally couple front flap 200 to rear cover 1600, this may also cause misalignment between front flap 1500 and rear cover 1600 in a closed configuration. As shown in FIG. 16, a closed configuration refers to front flap 1500 being substantially in contact with rear cover 1600. To ensure proper alignment between front flap 1500 and rear cover 1600 in a closed configuration, some embodiments include end panels 1508 in end region 1506. End panels 1508 may be configured to strengthen the end region 206 such that the end region 1506 maintains alignment of outer edges 1510a-c (collectively, "1510") of the front flap 1500 with respect to the lip portion 1604 of the rear cover 1600. End panels 1508 could be made of fiberglass, steel, carbon fiber, plastic, or combination thereof. In some embodiments, end segments 1508 can have a thickness that prevents them from showing through to a cosmetic surface of accessory unit 1400. In this way, end panels 208 can provide rigidity for the pivotal coupling between front flap 1500 and rear cover 1600 without affecting a cosmetic appearance of accessory unit 1400.

In FIG. 15, end region 1506 can include a material that is flexible and which thereby allows end region 1506 to bend. However, as a result of employing a flexible material in end region 1506, without end segments 1608 front flap 1600 can tend to bend relative to the rear cover 1600 at end region 1506 in undesirable directions other than about a major axis 1512 through end region 1506 under certain circumstances. In this regard, end segments 208 can be configured to prevent misalignment of outer edges 1510 of front flap 1500 with respect to lip portion 1604 when the accessory unit is subjected to forces in directions other than perpendicular to a major axis 1512 through the end region 1506.

Referring to FIG. 15, outer edges 1510 of front flap 1500 may contact lip portion 1604 when the front flap 1500 is in the closed configuration. Accordingly, front flap 1500 may define a substantially linear configuration when moved to the closed configuration. In this regard, end segments 1508 can be substantially coplanar with the other segments 1501a, 1501b, 1501c and the folding regions 1504 of the front flap 1500 when the front flap 1500 is in the closed (or folded) configuration. However, a portion of end region 1506 adjacent the end segments 1508 bends to enable the end region 1506 to function as a hinge, as noted above.

In some embodiments, as illustrated in FIG. 15, lip portion 1604 may extend outwardly beyond the outer edges 1510 of front flap 1500. In this regard, lip portion 1604 may function to protect a consumer electronic device received in the chamber 1610 (referred to in FIG. 16) in rear cover 1600 from damage to the edges of the consumer electronic device when dropped or otherwise subjected to impact. However, in other embodiments, the outer edges 1510 of the front flap 1500 and the lip portion 1604 may extend to the same dimensions, or the outer edges 1510 of the front flap 1500 may extend beyond the lip portion 1604. When used as a structural element, lip portion 1604 includes material having mechanical properties sufficient to retain the consumer electronic device within chamber 1610 of rear cover 1600. Moreover, in addition to the ability to retain the consumer electronic product within chamber 1610, lip portion 1604 also retains enough flexibility to allow the consumer electronic device to be inserted and removed from chamber 1610 numerous times without undue exertion by an end-user, a potentially damaged accessory unit 1400, or the consumer electronic device.

The material(s) defining the accessory unit 1500 may vary. In one embodiment, the entire accessory unit 1500 may be formed from a single material. However, as noted above, in other embodiments, it may be desirable to form the accessory unit 1500 from multiple materials to take advantage of differing material properties.

As shown in FIG. 15, accessory unit 1400 may further include one or more magnetic elements 1408 in front flap 1600. For example, magnetic elements 1408 disposed within segment 201a can be configured to interact with an attachment feature of a consumer electronic device positioned within rear cover 1600. Magnetic elements 1408 can be magnetically attracted to the attachment feature of the consumer electronic device when accessory unit 1400 is in a closed configuration such that the front flap 1500 is releasably retained in this configuration. The front flap 1500 may further include a magnetic element 1410 configured to interact with a magnetically sensitive circuit embedded in the consumer electronic device configured to detect the presence, absence, or change from presence to absence, or vice versa, of the magnetic element 1410. For example, the magnetically sensitive circuit may include a Hall Effect sensor.

Magnetic elements 1408 and 1410 of accessory unit 1400 can be configured to provide various other types of functionality. For example, the Hall Effect sensor can respond to the presence (or absence) of the magnetic field by generating a signal. The signal can be used to alter an operating state of the consumer electronic device. Magnetic element 1410 can be positioned on front flap 200 in a location that triggers the Hall Effect sensor to generate the signal when the cover is placed on or in proximity to a surface of the consumer electronic device. The signal can indicate that the front flap 200 is in a predetermined position relative to the consumer electronic device that can result in a change in an operating state of the consumer electronic device. The signal can also be used to alter the operating state to a state having functionality suitable for the consumer electronic device being fully covered.

In situations where the consumer electronic device includes a display, the functioning of the consumer electronic product can be altered in such a way that the display is prevented from displaying visual content. On the other hand, when the portion of front flap 1500 having magnetic element 1410 is removed to the point where the Hall Effect sensor no longer senses the magnetic field of magnetic element 1410, then the Hall Effect sensor can generate another signal. This other signal can result in the consumer electronic device entering a different operating state consistent with at least a portion of the display being uncovered and viewable. In this state, the functionality of the tablet computer can be altered such that the display is enabled to present visual content. It should be noted that the above described attachment feature, and the magnetically sensitive circuit are discussed in U.S. patent application entitled, "CONSUMER ELECTRONIC PRODUCT" by Lauder et al. filed Dec. 17, 2010 having application Ser. No. 12/971, 536, now U.S. Pat. No. 8,344,836, which is incorporated herein by reference in its entirety.

FIG. 16 shows accessory unit 1400 in a closed configuration. Further, in other embodiments, rear cover 1600 could be made with an adhesively formed base material, or alternative, rear cover could simply be an inner layer adhesively attached to an outer layer. In the embodiment shown in FIG. 2B, rear cover 1600 includes shell 118. Shell 1418 may be formed by a thermoforming process using plastic, compression molding, injection molding, or a combination thereof. Shell 1418 could be made from any rigid material known in the art for making a case for an electronic housing device. In addition to shell 1418, rear cover 1600 includes inner layer 1402 is attached to an inner surface of shell 1418, and outer layer 1404 is also attached to shell 1418. As shown FIG. 16, inner layer 1402 and outer layer 1404 generally terminate at one end near lip portion 1604 of rear cover. Inner layer 1402 and outer layer 1404 extend through rear cover 1600 to define an outer periphery of front flap 1600. Inner layer 1402 and outer layer 1404 generally terminate at another end near reinforcement element 1416. In some embodiment, reinforcement element 116 can be formed from a relatively rigid material such as plastic, steel, carbon fiber, fiberglass, etc. In the embodiment shown in FIG. 16, reinforcement element 1416 includes an adhesive disposed between inner layer 1402 and outer layer 1404.

Figure 17A:
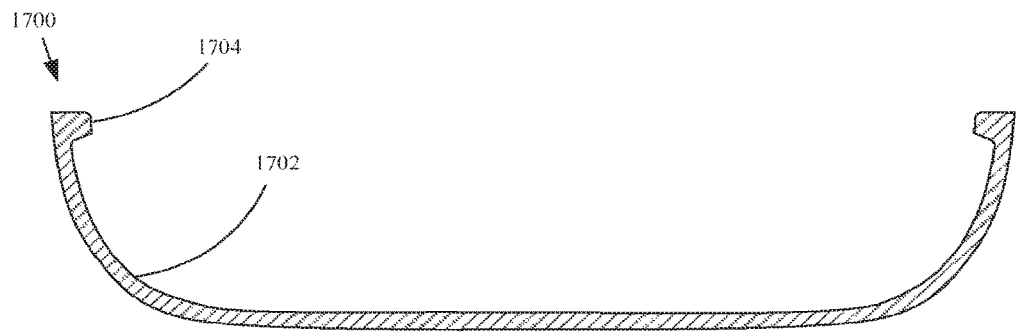
FIGS. 17A-17C illustrate cross-sectional side views various embodiments of shells.
Figure 17B:
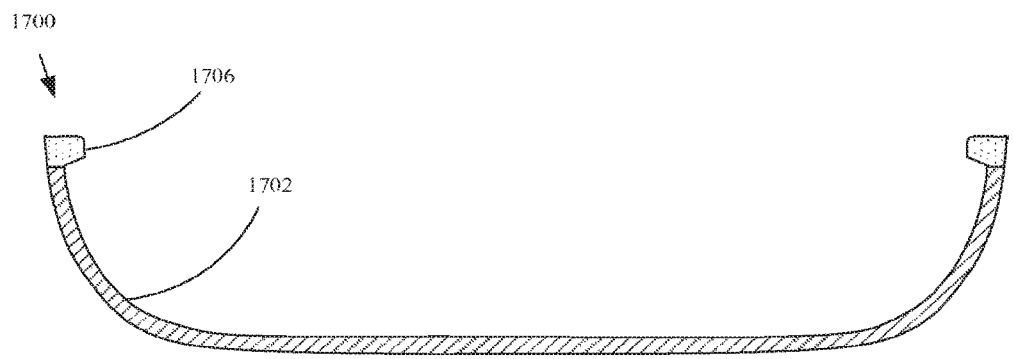
Figure 17C:
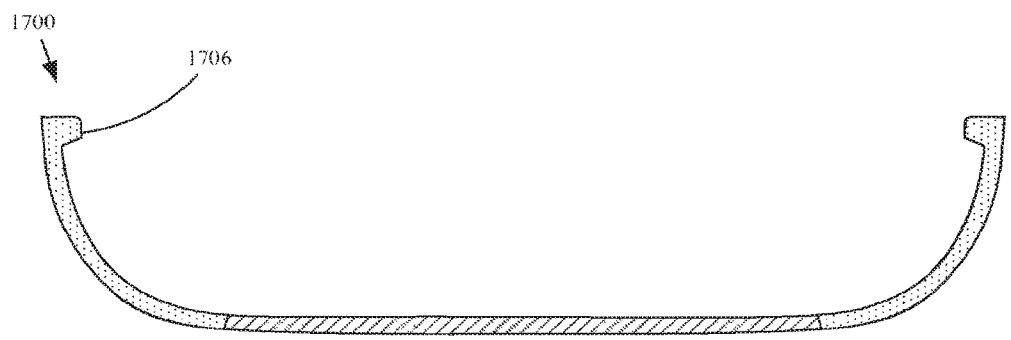

FIGS. 17A-17G show a process for forming rear cover portion of an accessory unit. For simplicity, this set of figures omits front flap 1500. FIGS. 17A-17C show various embodiments of shell 1700. In FIG. 3A, a thermoformed plastic shell 1700 made of a single material is depicted. A recessed portion 1702 of shell 1700 can have a substantially uniform thickness, while a lip portion 1704 can be integrally formed with recessed portion 1702. Lip portion 1704 can be injection molded on to recessed portion 1702, thereby removing any need for a subsequent bonding operation. In another embodiment shown in FIG. 17B, plastic recessed portion 1702 is compression molded to a lip portion 1706. In some embodiments, lip portion 1706 is made from reinforced glass fiber. Lip portion 1706 can be constructed by overlaying a number of unidirectional glass fibers in a continuous loop and then forming them in accordance with a geometry of lip portion 1706. In FIG. 17C, lip portion 1706 also includes a substantial portion of sidewalls and accordingly, forms a substantial portion of the recessed portion of shell 1700. Portions of a shell 1700 that include reinforced material (such as reinforced glass fiber) can substantially add to an overall stiffness of shell 1700.

Figure 17D:
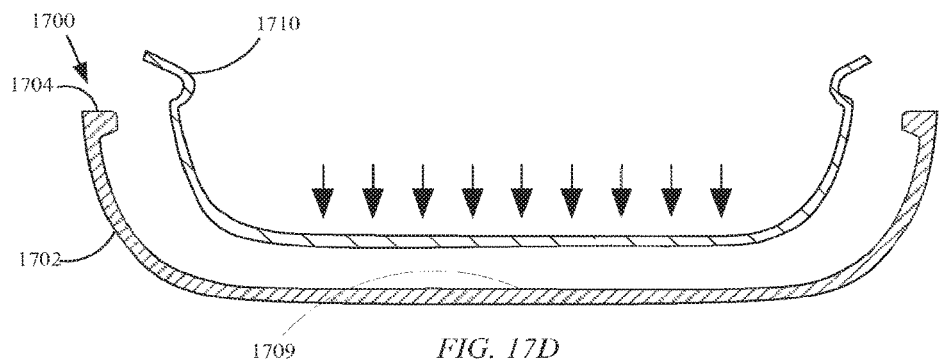
FIGS. 17D-17G illustrate cross-sectional side views schematically showing a method for forming a rear cover portion of an accessory unit.
Figure 17E:
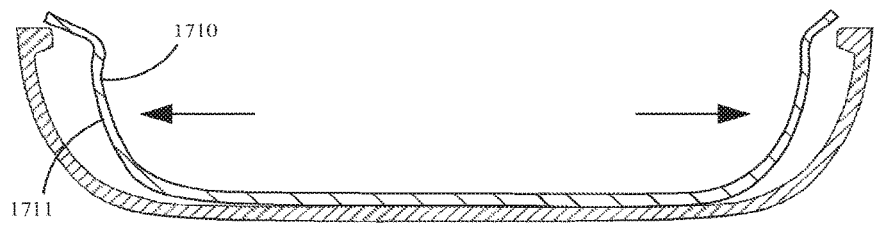

FIG. 17D shows a first assembly step, which depicts shell 1700 as depicted in FIG. 17A and a first layer 1710 (which may also be referred to as an inner layer). In some embodiments, shell 1700 can be a thermoformed plastic shell, a compression molded shell, an injection molded shell, or a combination thereof. In some embodiments, first layer 1710 is a microfiber layer; microfiber layer could further be a preformed microfiber layer. It should be understood that the embodiments shown in FIGS. 17B and 17C could also be used in the assembly steps shown in FIGS. 17D-17G. First layer 1710 can be a preformed microfiber layer. First layer 1710 can be adhesively coupled to a central portion 1709 of recessed portion 1802. In one embodiment, first layer 1710 can be adhesively coupled to shell 1700 by a thermoplastic adhesive, while in other embodiments a thermosetting adhesive can be utilized. In both cases, shell 1700 and first layer 1710 can be heated to activate the thermal adhesive. FIG. 17E shows a second step in which an expanding device is used to press peripheral portions 1711 of first layer 1710 around a lip portion 1704 of shell 1700, thereby adhesively engaging the peripheral portions of first layer 1710 about lip portion 1704 and along sidewalls of shell 1700. Because first layer 1710 is preformed to conform with an inside surface of shell 1700, undue stretching of first layer 1710 can be controlled and avoided. In this way, pin holes can be prevented from forming in first layer 1710, thereby preventing adhesive and/or a portion of shell 1700 from showing through first layer 1710.

Figure 17F:
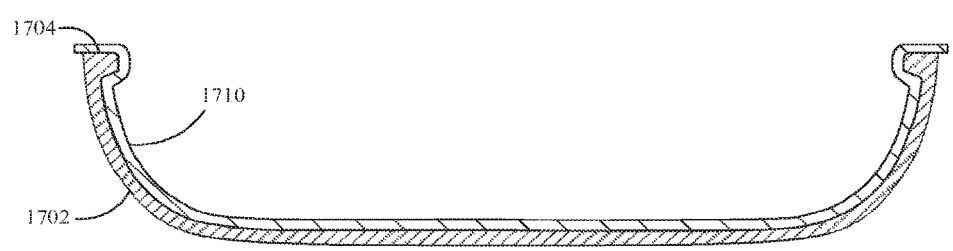
Figure 17G:
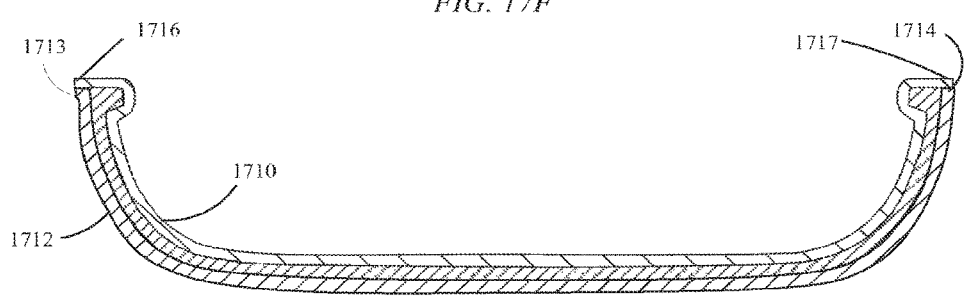

In FIG. 17F, once first layer 1710 is in adhesive contact with shell 1700 and while an expanding device (not shown) keeps the first layer 1710 under tension, an exposed portion of shell 1700 can be cooled at a controlled rate to establish desired characteristics in an adhesive coupling between first layer 1710 and shell 1700. For example, in some embodiments, cooling can be varied to provide varying stiffness across recessed portion 1702 and/or lip portion 1704. In FIG. 17G, second layer 1712 (also referred to as an outer layer) can be adhesively coupled to an exposed portion of shell 1700. Second layer 1712 could be made of leather. In one embodiment, the adhesive coupling can be accomplished using a concave fixture to press second layer 1712 against shell 1700. First end 1713 and second end 1714 of second layer 1712 can be coupled to first end 1716 and second end 1717, respectively, of first layer 1710. First layer 1710 and second layer 1712 can come together to form a substantially zero flange design. The phrase "zero flange design" refers to a bonded region of first layer 1710 and second layer 1712 that free of outward protrusion (with respect to shell 1700) of first layer 1710 or second layer 1712. In other words, the region where first layer 1710 is bonded to second layer 1712 extends from shell 1700 a distance approximately similar to a thickness (width) of first layer 1710 or second layer 1712). The zero flange design further maintains the bonded relationship between first layer 1710 and second layer 1712. An example of zero flange design is shown where second end 1714 of second layer 1712 bonds with first layer 1710. In some embodiments, a slight flange can be formed to increase surface area between the two layers, thereby improving adhesion. It should be noted that ideal fit and finish of an accessory unit is accomplished by tuning an amount of stretch in both first layer 1710 and second layer 1712. Also, the adhesive may be cured by, for example, radiation (from a light source such as ultraviolet (UV) light) and/or a time lapse sufficient for the adhesive to bond first layer 1710 and second layer 1712 to shell 1700. Other cooling means are further discussed below.

Figure 18A:
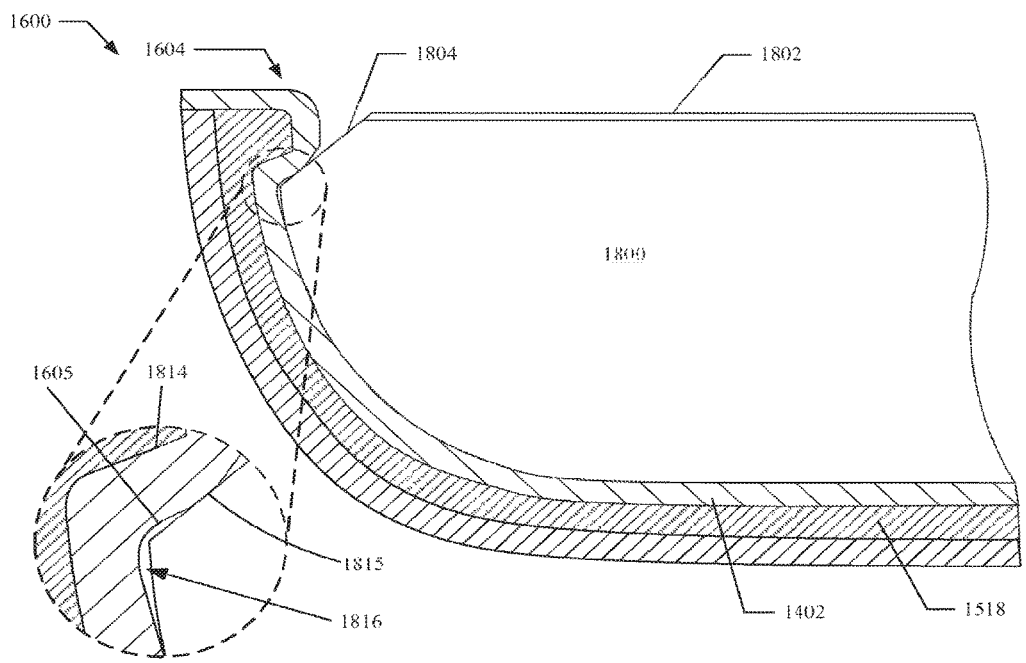
FIGS. 18A-18D illustrate a side cross sectional views showing various features relating to sidewalls of an accessory unit.

FIG. 18A shows a cross sectional view of a sidewall of rear cover 1600 having an electronic device 1800 disposed therein. This view shows how lip portion 1604 can act via interference fit to retain consumer electronic device 1800 in chamber 1610. When electronic device 1900 is inserted into rear cover 1600, lip portion 304 extends outward in a direction away from electronic device 1900, then retracts to the original (resting) position once the electronic device 1900 is fully received by the rear cover 1600. The interference fit can cause an electronic device 1900 to snap into place within an accessory unit due to a geometry of lip portion 1604 not conforming precisely to an outer surface of consumer electronic device 1800. In other words, the curvature of rear cover 1600 may not completely correspond to the curvature of electronic device 1900. FIG. 18A further illustrates a close-up showing relationship between lip portion 1604 and chamfered portion 1804 of electronic device 1800. Here, engaging region 1815 of the inner layer 1402 contacts electronic device 1800. However, edge 1605 of lip portion 1604 is angled such that inner layer 1402 does not contact electronic device 1800. The area is shown as disengaging region 1816. Such a configuration contributes to the snap effect during inserting and extracting electronic device 1800 from an accessory unit. It should be understood this relationship between extends around the perimeter of the lip portion 1604 and electronic device 1900.

This feature allows a user to have affirmative confirmation (for example, by hearing a "snap") that consumer electronic device 1800 is secured within an accessory unit, or when electronic device 1800 is released/removed from an accessory unit. Also, lip portion 1604 can avoid contacting display cover glass 1802. This allows all of display cover glass 1802 to remain visible, which may be desirable in embodiments in which electronic device 1800 includes a display that extends near the edges of the top surface of electronic device 1800.

In particular, the curvature of rear cover 1600 may not completely correspond to the curvature of electronic device. For example, FIG. 18A illustrates a close-up of the relationship between lip portion 304 and chamfered portion 1804 of electronic device 1800. Here, engaging region 1915 of the inner layer 1402 contacts electronic device 1800. However, a lower section of lip portion 1604 is angled such that inner layer 1402 does not contact electronic device 1800. The area is shown as disengaging region 1816. Such a configuration contributes to the snap effect of inserting and extracting electronic device 1800 from an accessory unit. It should be understood this relationship between extends around the perimeter of the lip portion 304 and electronic device 1800.

Figure 18B:
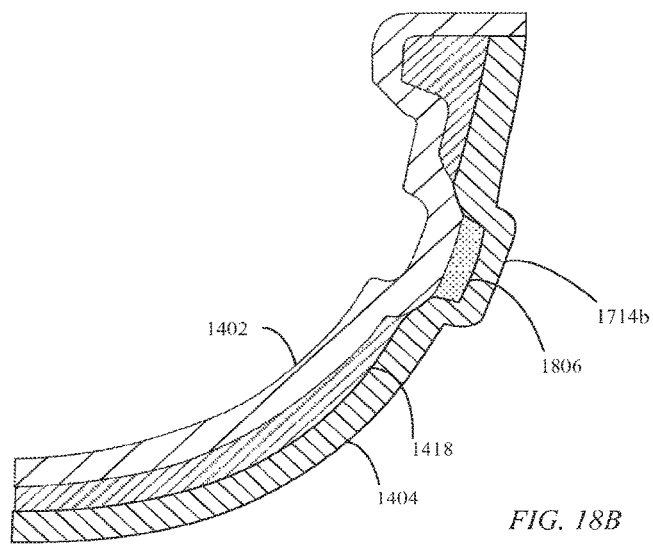

FIG. 18B shows a cross sectional view of a sidewall of rear cover 1600 that includes embossed portion 1714b. A tactile feel of embossed portion 1714b can be enhanced by adding a filling member 1806 suspended between inner layer 1402 and outer layer 1404. Filling member 1806 could include a plastic member other or a more flexible member such as silicone. In the embodiment shown in FIG. 18B, embossed portion 1714b can correspond to a volume control of an electronic device. A portion of shell 1418 has been removed to allow user interaction with the volume control. In this way filling member 1806 can provide a strong tactile feeling to a user manipulating the volume control. Inner layer 1402 and outer layer 1404 can cause filling member 1806 to hover in position and provide resistance in response to a user actuation. In some embodiments, filling member 1806 can be surrounded by low durometer rubber during an insert molding operation to provide additional spring/flexibility for actuation of the volume control. In other embodiments, additional tactile enhancements can be made. For example, a portion of outer layer 104 that engages filling member 1806 can be made thinner so that there is less compressible material (e.g, less outer layer 1404) when a user actuates the volume control. A treatment can be applied to the leather layer to adjust a hardness of the leather layer above filling member 1806. A skiving method (discussed below) could also be used to remove a portion of outer layer 1404.

Figure 18C:
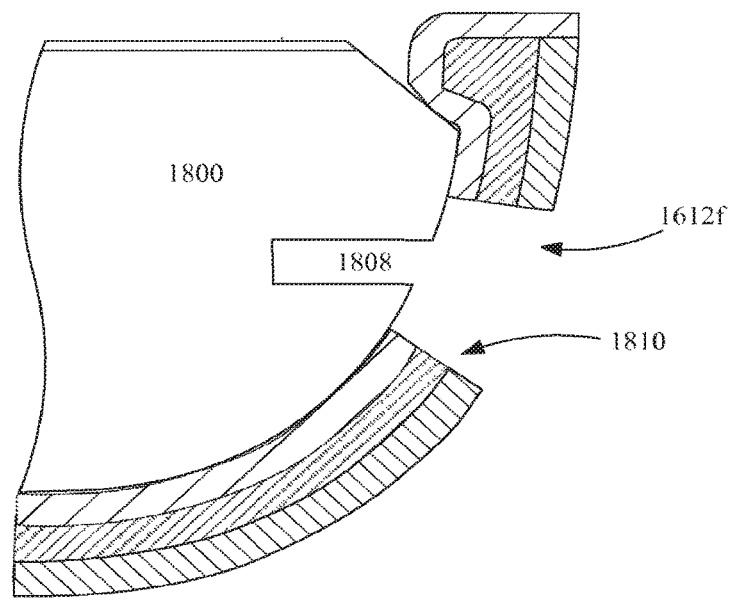
Figure 18D:
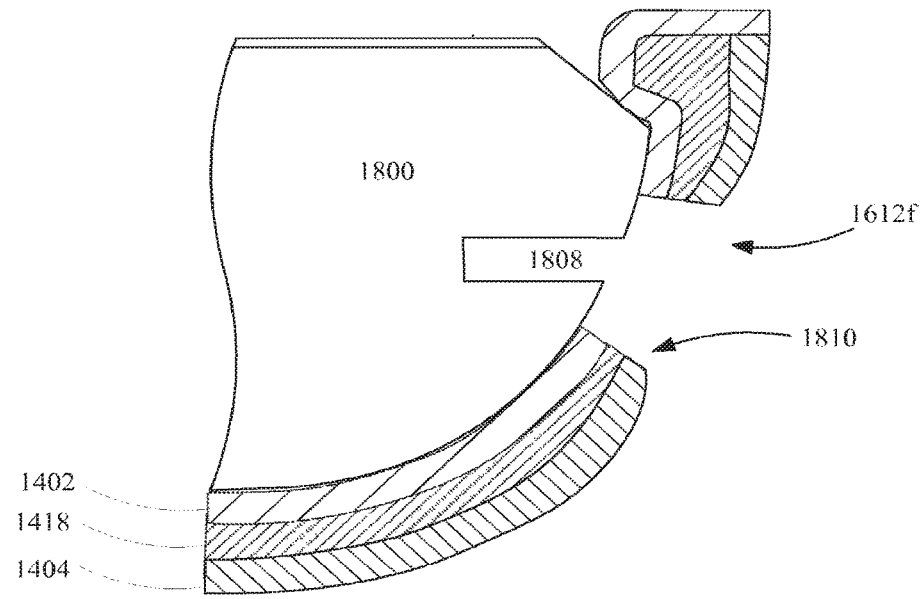

FIG. 18C shows a cross sectional side view of a sidewall or rear cover 1600 that includes an aperture 1612f for coupling a data cable to data port 1808 of electronic device 1800 disposed within an accessory unit. Depending on the electronic device, aperture 1612f could receive other members known in the art for coupling to an electronic device through an aperture of an accessory unit. Aperture 1612f can have sidewalls 1810 that extend normal from an outside surface of electronic device 1800. When compared with an aperture cut in a direction substantially parallel to a top surface of electronic device 1800, aperture 1612f avoids sharp angles jutting out and having a higher potential of fraying or even interfering with use of data port 1808. Rather, aperture 1812f, as shown in FIG. 18C, is cut such that the circular wall is normal to the surface of electronic device 1800. This design leaves edges of aperture 1612f less vulnerable to contact from external objects. While such an opening would normally require a three dimensional cutting path to be traced, a tapered cutter can be utilized to cut aperture 1612f as depicted without complexities associated with a three dimensional cutting path. FIG. 18D shows another configuration of aperture 1612f. In this embodiment, a debossed aperture 1612f is depicted. Here, shell 1418 is made thinner near aperture 1612f to provide an appearance of an accessory unit having a narrower width. In some embodiments, shell 1418 can end prior to aperture 1612f such that only inner layer and outer layers remain at the edge of aperture 1612f. In other embodiments, inner layer 1402 can made thinner and/or end prior to aperture 1612f.

It should be understood that the depicted techniques can be applied to any of apertures 312 as depicted in FIG. 1A. In contrast, apertures 312e (configured to audio from an electronic device to pass through accessory unit 100) can be formed using a different process. In one embodiment, apertures 312e can be drilled by a spindle head rotating at 80,000 rpm to create a substantially clean hole through rear cover 300. In other embodiments, a spiral shaped cutter can be used to form apertures 312e. The spiral shaped cutter can push chips towards a center portion of apertures 312e, thereby forming a clean cut.

FIGS. 19A-19E shows a series of illustrations describing a skiving method. Skiving can be applied by a skiving machine, to change characteristics of a fabric layer, and more specifically to change a material thickness of the fabric. A leather portion of front flap 200 may be too rigid along folding regions 204 (shown in FIGS. 1A-2A) for certain applications. This excessive rigidity may prohibit front flap 200 from easily folding to form a support structure. The skiving method offers a reliable method for removing material from front flap 200 to create, for example, folding regions 204.

Figure 19A:
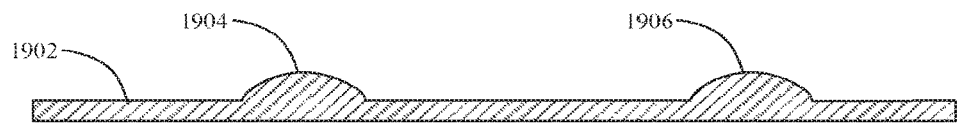
FIGS. 19A-19E illustrate cross sectional views showing a method for skiving a piece of fabric.
Figure 19B:
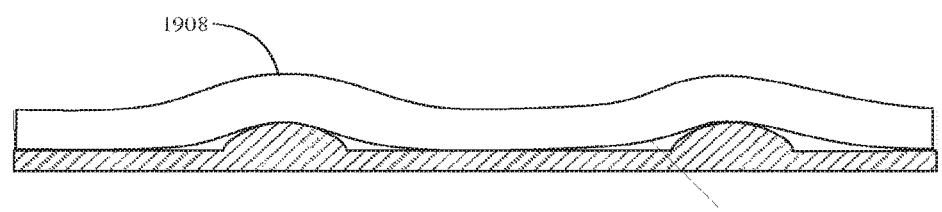
Figure 19C:
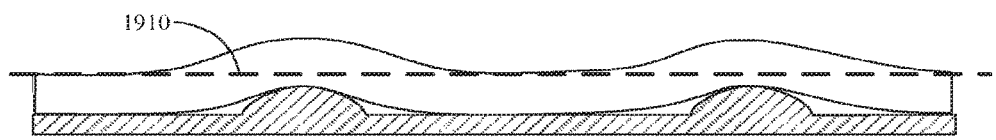
Figure 19D:
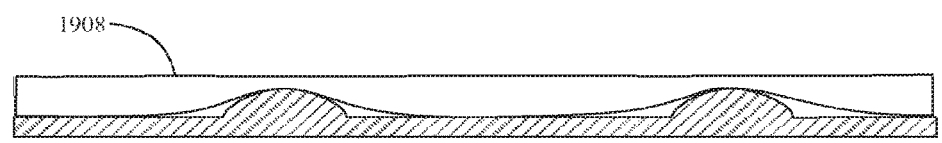
Figure 19E:

FIG. 19A shows a template 1902 configured to establish a skiving pattern. In some embodiments template 1902 can be made of plastic and can includes protrusions 1904, 1906 that determine where material is to be removed. Although protrusions 1904, 1906 are depicted as being substantially the same size and shape, other sizes and shapes are possible and can serve different purposes. In other embodiments, there could be at least three protrusions. In FIG. 19B, leather layer 1908 is laid across template 1902, with the cosmetic side 1909 contacting template 1902. By laying the cosmetic side 1909 against template 1902, subsequent cutting operations do not substantially affect an exterior finish of leather layer 1908. In FIG. 19C a cutting operation is performed along cutting line 1910. The cutting operation can be performed by a thin slicing blade that cuts parallel to a top surface of template 1902. FIG. 19D shows leather layer 1908 after the cutting operation. Because protrusions 1904, 1906 cause leather layer to curve gradually, a resulting thickness of leather layer 1908 also varies gradually (corresponding to protrusions 1904, 1906) to provide a smooth thickness transition. Finally, FIG. 19E shows leather layer 1908 removed from template 1902. It should be noted that in addition to increasing flexibility in folding regions 204, this skiving method can be used to provide space to embed various items beneath leather layer 1908. For example, flexible circuits, wiring, and even magnetic elements could be partially or completely hidden by such a technique.

Figure 20:
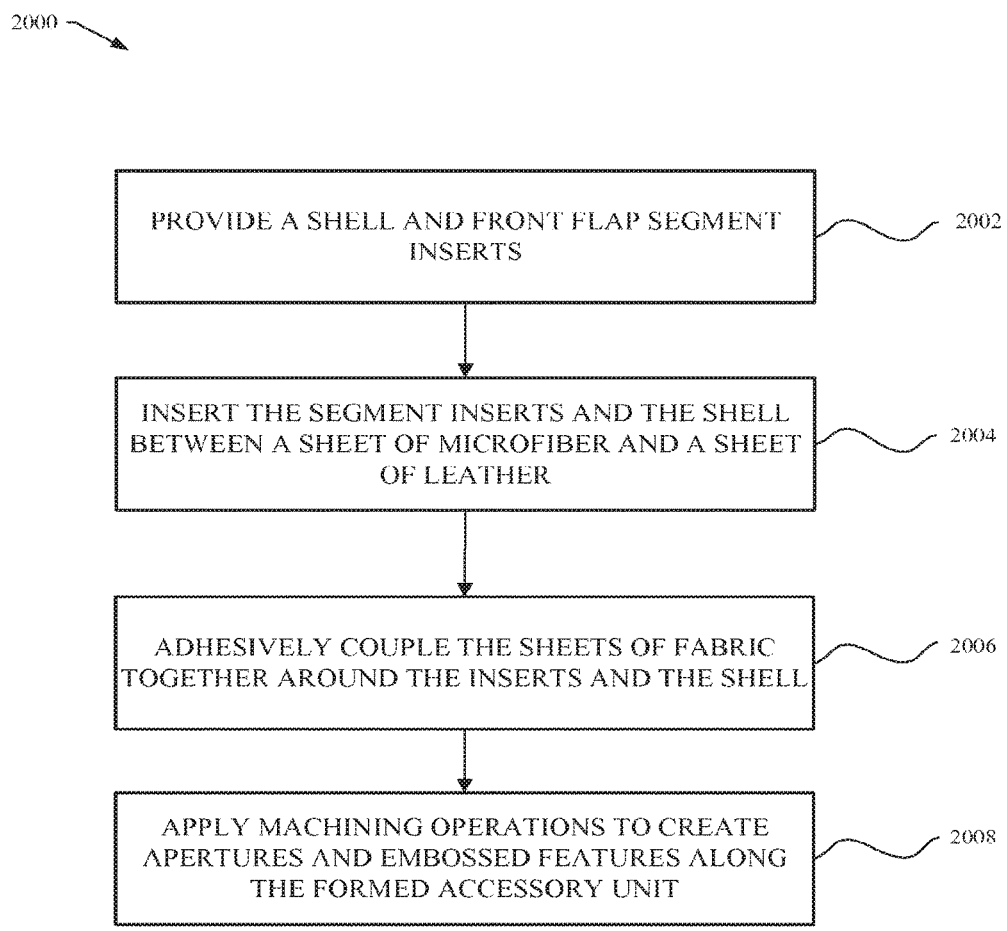
FIG. 20 illustrates a block diagram representing a method for assembling an accessory unit.

FIG. 20 shows a block diagram illustrating a method for assembling an accessory unit. In a first step 2002, a shell and front flap segment inserts are provided. In one embodiment the shell can be a thin walled thermoformed plastic shell and the segment inserts can be glass fiber. In other embodiments, the shell can be formed by compression molding, or a combination of thermoforming and compression molding. In step 2004, the shell and front flap segment inserts can be positioned between an outer layer and an inner layer. Segment inserts may include magnetic elements, filling elements (such as a plastic piece or silicone), or a combination thereof. In some embodiments, magnetic elements are formed inside the segments inserts, and accordingly, are disposed between the inner layer and the outer layer in conjunction with the segment inserts.

In step 2006, the outer layer and inner layer are adhesively coupled together around both the shell and the front flap segments. In some embodiments, a complex press can be utilized that seals the outer layer and inner layer around the shell and front flap in a single bonding (or laminating) operation. In other embodiments, the microfiber layer is first adhesively bonded to an inside surface of the shell. The adhesive bond can be established by a thermoplastic or thermosetting adhesive. One advantage of a thermosetting adhesive is that lower setting temperatures can be used and an applicator can be utilized to spread the adhesive at varying thicknesses thereby generating regions of greater and lesser rigidity. In addition, the leather layer is not subject to higher heat that is required to activate other adhesives.

Subsequent to bonding the microfiber layer to a bottom portion of the shell, a spreading element can be utilized to adhere peripheral portions to sidewalls of the shell, including a top side of a lip portion of the shell as well as the sidewalls of the shell. After the microfiber is pressed against the shell the shell, the shell can be cooled to cause the adhesive to properly set. Cooling means may include running coolant through the tool (spreading element), cooling the tool (which extracts heat from the microfiber/shell configuration), using air jets in the tool to push air onto the microfiber/shell configuration, switching out the heated tool with a cool tool, or a combination thereof. Next, the leather layer is adhered to an opposite side of the shell. Subsequently, the leather layer and microfiber seal around the front flap segment inserts and various other internal components of the accessory unit. In step 2008, a machining operation can be applied to form apertures and embossments along a surface of the accessory unit to provide easy access to controls on a compatible consumer electronic product.

FIGS. 21A-21D show various alternative hybrid shell embodiments. The hybrid shell embodiments each include a shell formed by compression molding at least two different materials together. In this way different characteristics can be provided to different portions of the shell. Each of the following embodiments can be formed during a single compression molding operation. In FIG. 21A shell 2100 is made from substantially stiff material such as glass fiber or a carbon fiber weave. Portions 2102 and 2104 can correspond to an input/output openings that can be areas of high strain. In this way the potential strain on the cover can be ameliorated. In FIG. 21B shell 2110 is made from substantially flexible material, such as a thermoplastic. Regions 2112 and 2114 can correspond to edge areas to firm up a feel of the edge portions of the accessory unit. In some embodiments this can prevent the accessory unit from having a floppy edge feel. In other words, the accessory unit feels rigid and robust when held by a user. In FIG. 21C, shell 2120 is made from a substantially flexible material and having an embedded attraction plate 2122 made from a magnetically attractable material such as steel. By embedding attraction the plate 2122 within shell 2120, magnetic elements within the front flap can attract to the attraction plate 2122, such that the front flap is secured to the shell 2120 during, for example, use of an electronic device. FIG. 21D shows a shell 2130 having a stiff outer periphery 2132 that can be formed from, for example, glass fiber. Outer periphery 2132 can include both a lip portion of shell 830 and at least sidewalls of shell 830, such that a protected electronic device is firmly seated within the accessory unit. The shells described in FIGS. 21A-D may include an outer layer (such as leather) disposed on an outer surface of the shell. It should be understood that the outer layer is sufficiently thin and/or the magnetic attraction is sufficiently strong such that front flap attracts to shell.

Indicia, such as a logo or symbol, may be disposed on the front flap and/or the rear cover. Indicia can be formed by removing a portion of a surface of the leather layer corresponding to a shape of the logo. Unfortunately, the consistency or uniformity of an underlying layer of leather can vary in accordance with a grain or other individual characteristic of the leather. To compensation, in some embodiments, the underlying layer can be treated with water or steam to provide a particular color for the indicia. Variations in temperature, time and/or operating pressure can affect the color or colors obtained. To further create indicia with a more uniform appearance, a dye or ink can be applied to the indicia.

Figure 22:
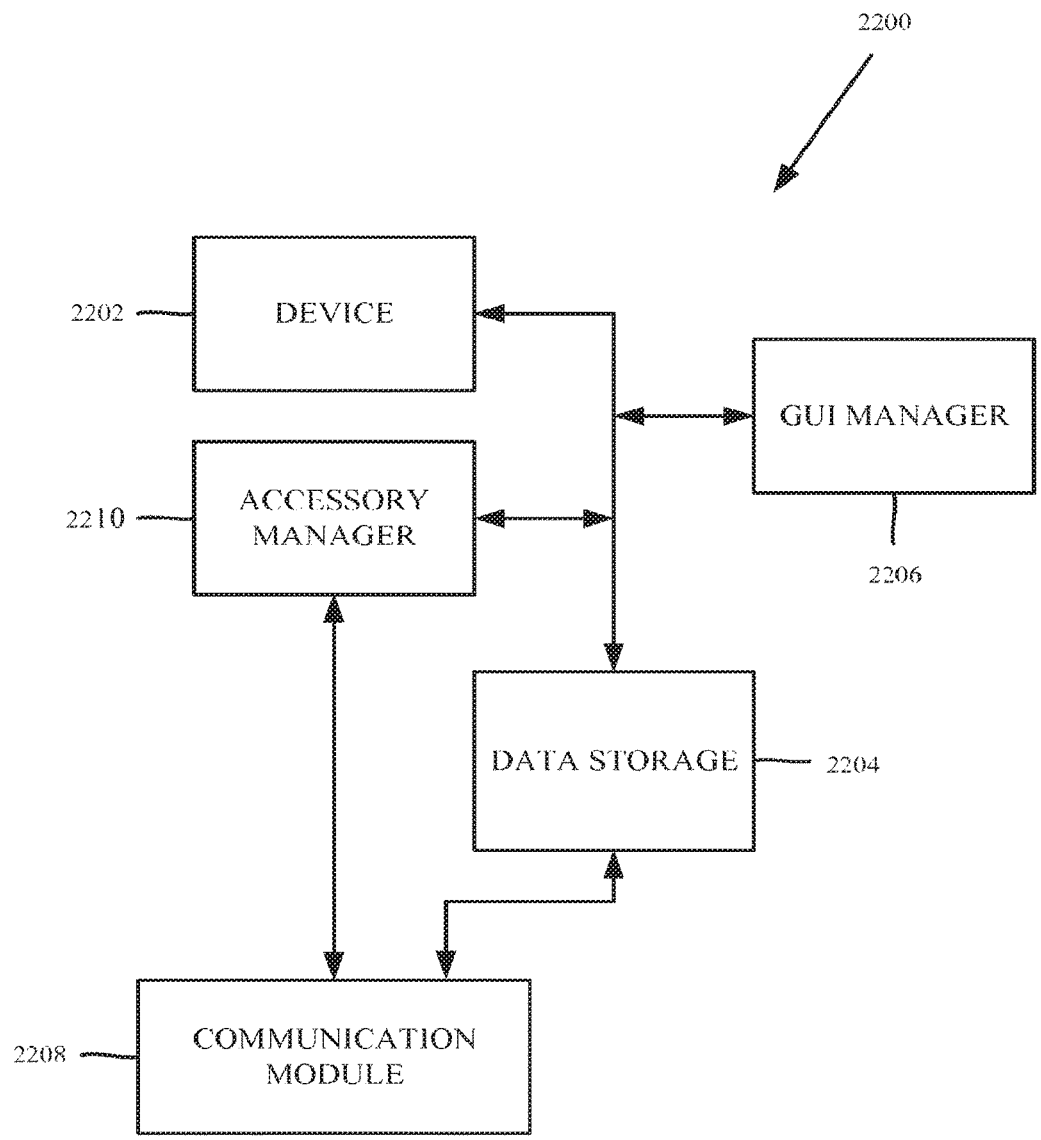
FIG. 22 is a block diagram of an arrangement of functional modules utilized by a portable media device.

FIG. 22 is a block diagram of an arrangement 2200 of functional modules utilized by an electronic device. The electronic device can, for example, be a tablet computer. The arrangement 2200 includes an electronic device 2202 that is able to output media for a user of the portable media device but also store and retrieve data with respect to data storage 2204. The arrangement 2200 also includes a graphical user interface (GUI) manager 2206. The GUI manager 2206 operates to control information being provided to and displayed on a display device. The arrangement 2200 also includes a communication module 2208 that facilitates communication between the portable media device and an accessory device. Still further, the arrangement 2200 includes an accessory manager 2210 that operates to authenticate and acquire data from an accessory device that can be coupled to the portable media device.

Figure 23:
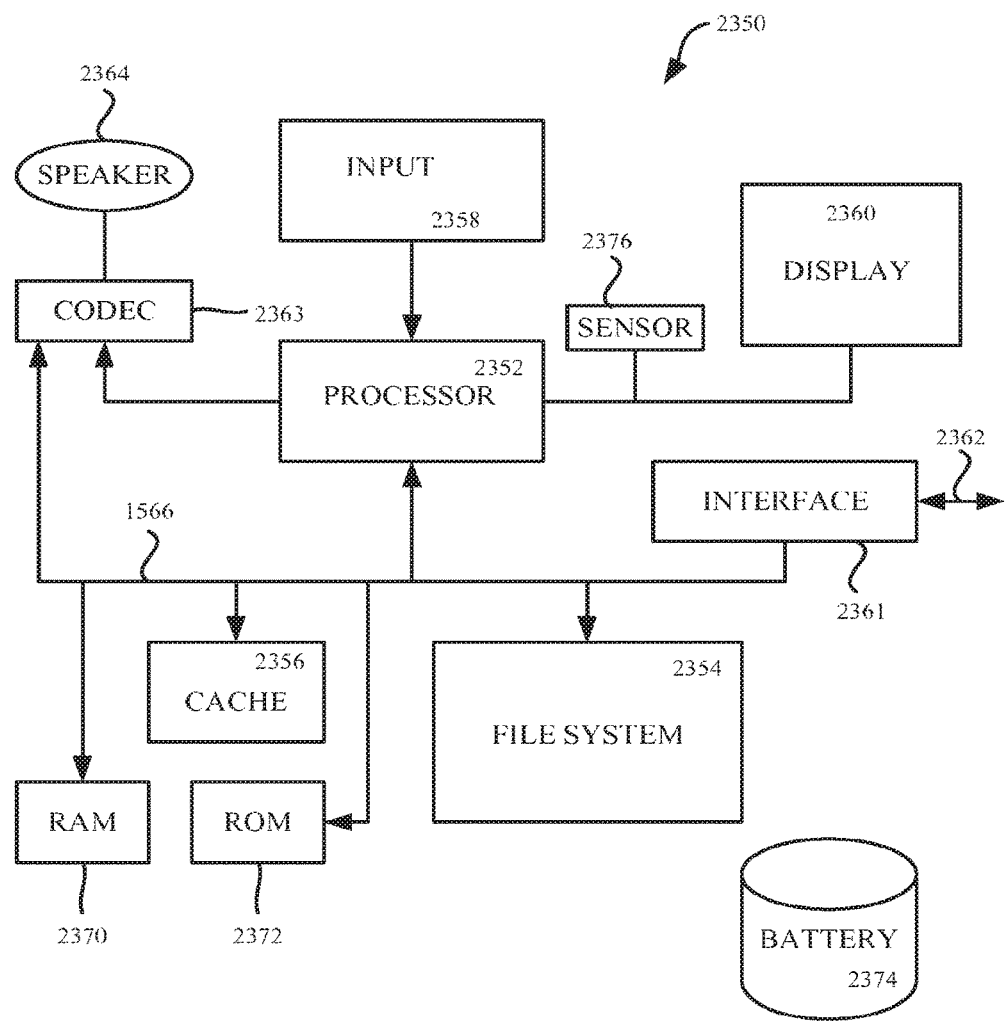
FIG. 23 is a block diagram of an electronic device suitable for use with the described embodiments.

FIG. 23 is a block diagram of an electronic device 2350 suitable for use with the described embodiments. The electronic device 2350 illustrates circuitry of a representative computing device. The electronic device 2350 includes a processor 2352 that pertains to a microprocessor or controller for controlling the overall operation of the electronic device 2350. The electronic device 2350 stores media data pertaining to media items in a file system 2354 and a cache 2356. The file system 2354 is, typically, a storage disk or a plurality of disks. The file system 2354 typically provides high capacity storage capability for the electronic device 2350. However, since the access time to the file system 2354 is relatively slow, the electronic device 2350 can also include a cache 2356. The cache 2356 is, for example, Random-Access Memory (RAM) provided by semiconductor memory. The relative access time to the cache 2356 is substantially shorter than for the file system 2354. However, the cache 2356 does not have the large storage capacity of the file system 2354. Further, the file system 2354, when active, consumes more power than does the cache 2356. The power consumption is often a concern when the electronic device 2350 is a portable media device that is powered by a battery 2374. The electronic device 2350 can also include a RAM 2370 and a Read-Only Memory (ROM) 2372. The ROM 2372 can store programs, utilities or processes to be executed in a non-volatile manner. The RAM 2370 provides volatile data storage, such as for the cache 2356.

The electronic device 2350 also includes a user input device 2358 that allows a user of the electronic device 1350 to interact with the electronic device 2350. For example, the user input device 1558 can take a variety of forms, such as a button, keypad, dial, touch screen, audio input interface, visual/image capture input interface, input in the form of sensor data, etc. Still further, the electronic device 2350 includes a display 2360 (screen display) that can be controlled by the processor 2352 to display information to the user. A data bus 2366 can facilitate data transfer between at least the file system 2354, the cache 2356, the processor 2352, and the CODEC 2363.

In one embodiment, the electronic device 2350 serves to store a plurality of media items (e.g., songs, podcasts, etc.) in the file system 2354. When a user desires to have the electronic device play a particular media item, a list of available media items is displayed on the display 1560. Then, using the user input device 2358, a user can select one of the available media items. The processor 2352, upon receiving a selection of a particular media item, supplies the media data (e.g., audio file) for the particular media item to a coder/decoder (CODEC) 2363. The CODEC 1563 then produces analog output signals for a speaker 2364. The speaker 2364 can be a speaker internal to the electronic device 2350 or external to the electronic device 2350. For example, headphones or earphones that connect to the electronic device 2350 would be considered an external speaker.

The electronic device 2350 also includes a network/bus interface 2361 that couples to a data link 2362. The data link 2362 allows the electronic device 2350 to couple to a host computer or to accessory devices. The data link 2362 can be provided over a wired connection or a wireless connection. In the case of a wireless connection, the network/bus interface 2361 can include a wireless transceiver. The media items (media assets) can pertain to one or more different types of media content. In one embodiment, the media items are audio tracks (e.g., songs, audio books, and podcasts). In another embodiment, the media items are images (e.g., photos). However, in other embodiments, the media items can be any combination of audio, graphical or visual content. Sensor 2376 can take the form of circuitry for detecting any number of stimuli. For example, sensor 2376 can include a Hall Effect sensor responsive to external magnetic field, an audio sensor, a light sensor such as a photometer, and so on.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A case for a portable electronic device, the portable electronic device having a housing, the case comprising:
    a recessed portion having a sidewall;
    a lip portion integrally formed with the recessed portion, wherein the recessed portion and the lip portion cooperate to define a chamber, the lip portion comprising a resilient material and configured to retain the portable electronic device within the chamber, the lip portion further comprising an edge having a shape that defines an opening suitable for receiving the portable electronic device, wherein the edge directly engages the housing;
    an inner layer disposed on an inner surface the chamber; and
    an outer layer disposed on an outer surface of the chamber,
    wherein the inner layer and the outer layer extend to define a front flap, and
    wherein the sidewall and the lip portion cooperate to provide an affirmative feedback indicating that the portable electronic device is fully secured within the chamber.

2. The case according to claim 1, wherein the front flap comprises:
    a first segment having a first opening;
    a second segment having a second opening; and
    a bending region between the first segment and the second segment,
    wherein in a closed configuration the flap engages the lip portion of the chamber.

3. The case according to claim 2, further comprising an end region adapted to allow the front flap to pivotally couple to the chamber, the end region having a first end segment embedded in the end region, the first end segment configured to align the front flap with the chamber in the closed configuration.

4. The case according to claim 1, wherein during a receiving event, the edge of the lip portion engages the housing such that the lip portion initially expands from an original position to an expanded position to accommodate the housing and snaps back to the original position in accordance with the affirmative feedback.

5. The case according to claim 1, wherein an insertion of the portable electronic device defines an insertion configuration, and wherein the edge of the lip portion is angled such that at least one portion of the inner layer is free of engagement with the electronic device during the insertion configuration.

6. The case according to claim 5, wherein the at least one portion of the inner layer is positioned below the lip portion.

7. The case according to claim 1, further comprising an aperture region on a curved surface of the chamber, the aperture region comprising a first aperture in the outer layer, a second aperture in the chamber and a third aperture in the inner layer, the first aperture being concentric with the second aperture and the third aperture.

8. The case according to claim 7, wherein:
the aperture region includes a first diameter and a second diameter; and
the first diameter is larger than the second diameter.

9. The case according to claim 7, wherein the third aperture is larger than the first aperture, and wherein the third aperture is larger than the second aperture.

10. The case according to claim 7, wherein the outer layer has a first thickness, the chamber has a second thickness, and the inner layer has a third thickness, and wherein the third thickness is less than the first thickness near the aperture region.

11. The method according to claim 1, further comprising forming an aperture region on a curved surface of the chamber, the aperture region comprising:
a first aperture in the outer layer;
a second aperture in the chamber; and
a third aperture in the inner layer, the first aperture being concentric with the second aperture and the third aperture.

12. A method for forming a case for a portable electronic device, the portable electronic device having a housing, the method comprising:
forming a recessed portion having a sidewall;
integrally forming a lip portion with the recessed portion, wherein the recessed portion and the lip portion cooperate to define a chamber that comprises a curved surface, the lip portion comprising a resilient material and configured to retain the portable electronic device within the chamber, the lip portion further comprising an edge having a shape that defines an opening suitable for receiving the portable electronic device, wherein the edge directly engages the housing;
providing an inner layer; and
providing an outer layer, wherein the inner layer and the outer layer extend to define a front flap, and wherein the sidewall and the lip portion cooperate to provide an affirmative feedback indicating that the portable electronic device is fully secured within the chamber.

13. The method of claim 12, wherein the front flap comprises:
a first segment having a first opening;
a second segment having a second opening; and
a bending region between the first segment and the second segment,
wherein in a closed configuration of the flap engages the lip portion of the chamber.

14. The method according to claim 13, further comprising an end region adapted to allow the front flap to pivotally couple to the chamber, the end region having a first end segment embedded in the end region, the first end segment configured to align the front flap with the chamber in the closed configuration.

15. The method according to claim 12, wherein during a receiving event, the edge of the lip portion engages the housing such that the lip portion initially expands from an original position to an expanded position to accommodate the housing and snaps back to the original position in accordance with the affirmative feedback.

* * * * *